United States Patent
Ziemba et al.

(10) Patent No.: US 10,991,553 B2
(45) Date of Patent: Apr. 27, 2021

(54) NANOSECOND PULSER THERMAL MANAGEMENT

(71) Applicant: Eagle Harbor Technologies, Inc., Seattle, WA (US)

(72) Inventors: Timothy Ziemba, Bainbridge Island, WA (US); Ilia Slobodov, Seattle, WA (US); John Carscadden, Seattle, WA (US); Kenneth Miller, Seattle, WA (US); Connor Liston, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 108 days.

(21) Appl. No.: 16/524,926

(22) Filed: Jul. 29, 2019

(65) Prior Publication Data

US 2020/0037468 A1   Jan. 30, 2020

Related U.S. Application Data

(63) Continuation-in-part of application No. 16/523,840, filed on Jul. 26, 2019.
(Continued)

(51) Int. Cl.
*H05K 7/20* (2006.01)
*H01J 37/32* (2006.01)
(Continued)

(52) U.S. Cl.
CPC .. *H01J 37/32146* (2013.01); *H01J 37/32082* (2013.01); *H01J 37/32091* (2013.01);
(Continued)

(58) Field of Classification Search
CPC .......... H05K 7/20281; H05K 7/20509; H05K 7/20254; H05K 7/20272; H05K 7/20154;
(Continued)

(56) References Cited

U.S. PATENT DOCUMENTS

| 4,070,589 A | 1/1978 | Martinkovic |
| 4,504,895 A | 3/1985 | Steigerwald |

(Continued)

FOREIGN PATENT DOCUMENTS

| CA | 2292526 A1 | 12/1999 |
| EP | 174164 A2 | 3/1986 |

(Continued)

OTHER PUBLICATIONS

Partial Supplementary European Search Report in related foreign application No. 14861818.4, 12 Pages.
(Continued)

*Primary Examiner* — Haissa Philogene

(57) ABSTRACT

Some embodiments include a thermal management system for a nanosecond pulser. In some embodiments, the thermal management system may include a switch cold plates coupled with switches, a core cold plate coupled with one or more transformers, resistor cold plates coupled with resistors, or tubing coupled with the switch cold plates, the core cold plates, and the resistor cold plates. The thermal management system may include a heat exchanger coupled with the resistor cold plates, the core cold plate, the switch cold plate, and the tubing. The heat exchanger may also be coupled with a facility fluid supply.

24 Claims, 19 Drawing Sheets

Related U.S. Application Data

(60) Provisional application No. 62/789,523, filed on Jan. 8, 2019, provisional application No. 62/789,526, filed on Jan. 8, 2019, provisional application No. 62/717,523, filed on Aug. 10, 2018, provisional application No. 62/711,457, filed on Jul. 27, 2018, provisional application No. 62/711,406, filed on Jul. 27, 2018, provisional application No. 62/711,464, filed on Jul. 27, 2018, provisional application No. 62/711,468, filed on Jul. 27, 2018, provisional application No. 62/711,467, filed on Jul. 27, 2018, provisional application No. 62/711,347, filed on Jul. 27, 2018, provisional application No. 62/711,334, filed on Jul. 27, 2018.

(51) Int. Cl.
| | |
|---|---|
| H01L 21/683 | (2006.01) |
| H01L 21/687 | (2006.01) |
| H02M 3/335 | (2006.01) |
| H03K 3/57 | (2006.01) |
| H03M 1/12 | (2006.01) |

(52) U.S. Cl.
CPC .. *H01J 37/32128* (2013.01); *H01J 37/32174* (2013.01); *H01J 37/32541* (2013.01); *H01J 37/32568* (2013.01); *H01J 37/32715* (2013.01); *H01L 21/6833* (2013.01); *H01L 21/68757* (2013.01); *H02M 3/33523* (2013.01); *H03K 3/57* (2013.01); *H03M 1/12* (2013.01); *H05K 7/20154* (2013.01); *H05K 7/20172* (2013.01); *H05K 7/20254* (2013.01); *H05K 7/20272* (2013.01); *H05K 7/20281* (2013.01); *H05K 7/20509* (2013.01)

(58) Field of Classification Search
CPC ............ H05K 7/20163; H05K 7/20172; H01J 37/32146; H01J 37/32541; H01J 37/32568; H01J 37/32082; H01J 37/32715; H01J 37/32128; H01J 37/32174; H01J 37/32091; H02M 3/33523; H02M 2001/0048; H02M 2001/0064; H02M 2001/327; H01L 21/68757; H01L 21/6833; F25B 23/006; F28D 15/0275

See application file for complete search history.

(56) References Cited

U.S. PATENT DOCUMENTS

| | | | |
|---|---|---|---|
| 4,885,074 A | 12/1989 | Susko et al. | |
| 4,992,919 A | 2/1991 | Lee et al. | |
| 5,140,510 A | 8/1992 | Myers | |
| 5,313,481 A | 5/1994 | Cook et al. | |
| 5,321,597 A | 6/1994 | Ziemba et al. | |
| 5,392,043 A | 2/1995 | Ribner | |
| 5,392,187 A | 2/1995 | Baliga | |
| 5,451,846 A | 9/1995 | Peterson et al. | |
| 5,483,731 A | 1/1996 | Prendel et al. | |
| 5,488,552 A | 1/1996 | Sakamoto et al. | |
| 5,610,452 A | 3/1997 | Shimer et al. | |
| 5,729,562 A | 3/1998 | Birx et al. | |
| 5,796,598 A | 8/1998 | Nowak et al. | |
| 5,808,504 A | 9/1998 | Chikai et al. | |
| 5,905,646 A | 5/1999 | Crewson et al. | |
| 5,930,125 A | 7/1999 | Hitchcock et al. | |
| 5,933,335 A | 8/1999 | Hitchcock et al. | |
| 5,947,300 A | 9/1999 | Lange | |
| 5,968,377 A | 10/1999 | Yuasa et al. | |
| 6,359,542 B1 | 3/2002 | Vvidmayer et al. | |
| 6,496,047 B1 | 12/2002 | Iskander et al. | |
| 6,577,135 B1 | 6/2003 | Matthews et al. | |
| 6,741,120 B1 | 5/2004 | Tan | |
| 6,741,484 B2 | 5/2004 | Crewson | |
| 6,831,377 B2 | 12/2004 | Yampolsky | |
| 6,897,574 B2 | 5/2005 | Vaysse | |
| 7,061,230 B2 | 6/2006 | Kleine | |
| 7,180,082 B1 | 2/2007 | Hassanein | |
| 7,291,545 B2 | 11/2007 | Collins et al. | |
| 7,307,375 B2 | 12/2007 | Smith et al. | |
| 7,319,579 B2 | 1/2008 | Inoue et al. | |
| 7,492,138 B2 | 2/2009 | Zhanh et al. | |
| 7,512,433 B2 | 3/2009 | Bernhart et al. | |
| 7,521,370 B2 | 4/2009 | Hoffman | |
| 7,549,461 B2 * | 6/2009 | Kroliczek | F25B 23/006 165/104.21 |
| 7,605,385 B2 | 10/2009 | Bauer | |
| 7,901,930 B2 | 3/2011 | Kuthi et al. | |
| 7,936,544 B2 | 5/2011 | Beland | |
| 7,948,185 B2 | 5/2011 | Smith et al. | |
| 8,093,797 B2 | 1/2012 | Wilson | |
| 8,115,343 B2 | 2/2012 | Sanders et al. | |
| 8,129,653 B2 | 3/2012 | Kirchmeier et al. | |
| 8,143,790 B2 | 3/2012 | Smith et al. | |
| 8,222,936 B2 | 7/2012 | Freidman et al. | |
| 8,259,476 B2 | 9/2012 | Ben-Yaakov et al. | |
| 8,723,591 B2 | 5/2014 | Lee | |
| 8,773,184 B1 | 7/2014 | Petrov | |
| 9,067,788 B1 | 6/2015 | Spielman | |
| 9,122,350 B2 | 9/2015 | Kao et al. | |
| 9,287,086 B2 | 3/2016 | Brouk et al. | |
| 9,287,092 B2 | 3/2016 | Brouk et al. | |
| 9,306,533 B1 | 4/2016 | Mavretic | |
| 9,329,256 B2 | 5/2016 | Murad | |
| 9,417,739 B2 | 8/2016 | Cordeiro et al. | |
| 9,435,029 B2 | 9/2016 | Brouk et al. | |
| 9,601,283 B2 | 3/2017 | Ziemba et al. | |
| 9,706,630 B2 | 7/2017 | Miller et al. | |
| 9,767,988 B2 | 9/2017 | Brouk et al. | |
| 9,960,763 B2 | 5/2018 | Miller et al. | |
| 10,009,024 B2 | 6/2018 | Gan et al. | |
| 10,020,800 B2 | 7/2018 | Prager et al. | |
| 10,027,314 B2 | 7/2018 | Prager et al. | |
| 10,224,822 B2 | 3/2019 | Miller et al. | |
| 10,373,804 B2 | 8/2019 | Koh | |
| 10,382,022 B2 | 8/2019 | Prager et al. | |
| 10,460,910 B2 | 10/2019 | Ziemba et al. | |
| 10,483,089 B2 | 11/2019 | Ziemba et al. | |
| 10,607,814 B2 | 3/2020 | Ziemba et al. | |
| 10,659,019 B2 * | 5/2020 | Slobodov | H01L 21/68757 |
| 2001/0008552 A1 | 7/2001 | Harada | |
| 2002/186577 A1 | 12/2002 | Kirbie | |
| 2003/0021125 A1 | 1/2003 | Rufer et al. | |
| 2003/0071035 A1 | 4/2003 | Brailove | |
| 2003/0137791 A1 | 7/2003 | Arnet et al. | |
| 2003/0169107 A1 | 9/2003 | Lechevalier | |
| 2004/0149217 A1 | 8/2004 | Collins et al. | |
| 2005/0152159 A1 | 7/2005 | Isurin et al. | |
| 2006/0192774 A1 | 8/2006 | Yasumura | |
| 2006/0210020 A1 | 9/2006 | Takahashi | |
| 2006/0274887 A1 | 12/2006 | Sakamoto | |
| 2007/0018504 A1 | 1/2007 | Weiner et al. | |
| 2007/0114981 A1 | 5/2007 | Vasquez et al. | |
| 2007/0115705 A1 | 5/2007 | Gotzenberger | |
| 2007/0212811 A1 | 9/2007 | Hanawa et al. | |
| 2008/0062733 A1 | 3/2008 | Gay | |
| 2008/0106151 A1 | 5/2008 | Ryoo | |
| 2008/0143260 A1 | 6/2008 | Tuymer | |
| 2008/0198634 A1 | 8/2008 | Scheel | |
| 2008/0252225 A1 | 10/2008 | Kurachi et al. | |
| 2008/0272706 A1 | 11/2008 | Kwon et al. | |
| 2009/0016549 A1 | 1/2009 | French et al. | |
| 2010/0007358 A1 | 1/2010 | Schaerrer | |
| 2010/0148847 A1 | 6/2010 | Schurack et al. | |
| 2010/0284208 A1 | 11/2010 | Nguyen | |
| 2011/0001438 A1 | 1/2011 | Chemel et al. | |
| 2011/0140607 A1 | 6/2011 | Moore et al. | |
| 2012/0016282 A1 | 1/2012 | Van Brunt et al. | |
| 2012/0081350 A1 | 4/2012 | Sano et al. | |
| 2012/0155613 A1 | 6/2012 | Caiafa | |

(56) References Cited

U.S. PATENT DOCUMENTS

| | | |
|---|---|---|
| 2013/0024784 A1 | 1/2013 | Said |
| 2013/0075390 A1 | 3/2013 | Ashida |
| 2013/0113650 A1 | 5/2013 | Behbahani et al. |
| 2013/0174105 A1 | 7/2013 | Nishio et al. |
| 2013/0175575 A1 | 7/2013 | Ziemba et al. |
| 2014/0009969 A1 | 1/2014 | Yuzurihara |
| 2014/0021180 A1 | 1/2014 | Vogel |
| 2014/0077611 A1 | 3/2014 | Young et al. |
| 2014/0109886 A1 | 4/2014 | Singleton et al. |
| 2014/0118414 A1 | 5/2014 | Seo et al. |
| 2014/0146571 A1 | 5/2014 | Ryoo |
| 2014/0268968 A1 | 9/2014 | Richardson |
| 2014/0354343 A1 | 12/2014 | Ziemba et al. |
| 2015/0028932 A1 | 1/2015 | Ziemba et al. |
| 2015/0076372 A1 | 3/2015 | Ziemba et al. |
| 2015/0084509 A1 | 3/2015 | Yuzurihara et al. |
| 2015/0130525 A1 | 5/2015 | Miller et al. |
| 2015/0256086 A1 | 9/2015 | Miller et al. |
| 2015/0303914 A1 | 10/2015 | Ziemba et al. |
| 2015/0311680 A1 | 10/2015 | Burrows et al. |
| 2015/0318846 A1 | 11/2015 | Prager et al. |
| 2016/0020070 A1 | 1/2016 | Brouk et al. |
| 2016/0241234 A1 | 8/2016 | Mavretic |
| 2016/0327029 A1 | 11/2016 | Ziemba et al. |
| 2016/0327089 A1 | 11/2016 | Adam et al. |
| 2017/0243731 A1 | 8/2017 | Ziemba et al. |
| 2017/0294842 A1 | 10/2017 | Miller et al. |
| 2017/0311431 A1 | 10/2017 | Park |
| 2017/0359886 A1 | 12/2017 | Binderbauer et al. |
| 2018/0226896 A1 | 8/2018 | Miller et al. |
| 2018/0286636 A1 | 10/2018 | Ziemba et al. |
| 2018/0315583 A1 | 11/2018 | Luere et al. |
| 2018/0374689 A1 | 12/2018 | Abraham et al. |
| 2019/0080884 A1 | 3/2019 | Ziemba et al. |
| 2019/0157044 A1 | 5/2019 | Ziemba et al. |
| 2019/0172685 A1 | 6/2019 | Van Zyl et al. |
| 2019/0180982 A1 | 6/2019 | Brouk et al. |
| 2019/0228952 A1 | 7/2019 | Dorf |
| 2019/0393791 A1 | 8/2019 | Ziemba et al. |
| 2019/0326092 A1 | 10/2019 | Ogasawara |
| 2019/0348258 A1 | 11/2019 | Koh et al. |
| 2020/0035458 A1* | 1/2020 | Ziemba .................. H03K 3/53 |
| 2020/0037468 A1* | 1/2020 | Ziemba ............. H01J 37/32541 |

FOREIGN PATENT DOCUMENTS

| | | |
|---|---|---|
| EP | 0947048 A1 | 10/1999 |
| EP | 1128557 A2 | 8/2001 |
| EP | 1515430 | 3/2005 |
| WO | 0193419 A1 | 12/2001 |
| WO | 2018186901 A1 | 10/2018 |

OTHER PUBLICATIONS

U.S. Final Office Action in U.S. Appl. No. 14/542,487 dated Dec. 19, 2017, 07 pages.
U.S. Final Office Action in U.S. Appl. No. 14/798,154 dated Dec. 28, 2017, 06 pages.
U.S. Notice of Allowance in U.S. Appl. No. 14/542,487 dated Mar. 21, 2018, 05 pages.
U.S. Non-Final Office Action in U.S. Appl. No. 15/921,650 dated Nov. 28, 2018, 11 pages.
U.S. Notice of Allowance in U.S. Appl. No. 15/921,650 dated Apr. 4, 2019, 7 pages.
U.S. Non Final Office Action in U.S. Appl. No. 16/178,565, dated Apr. 4, 2019, 10 pages.
U.S. Final Office Action in U.S. Appl. No. 16/178,565, dated Jul. 12, 2019, 11 pages.
U.S. Notice of Allowance in U.S. Appl. No. 16/178,565, dated Nov. 14, 2019, 5 pages.
International Search Report and Written Opinion as issued in connection with International Patent Application No. PCTUS2019/ 043932, dated Dec. 5, 2019, 16 pages.
U.S. Notice of Allowance in U.S. Appl. No. 16/250,157 dated Apr. 13, 2020, 8 pages.
International Search Report and Written Opinion as issued in connection with International Patent Application No. PCTUS20/ 16253, dated Apr. 29, 2020, 5 pages.
U.S. Notice of Allowance in U.S. Appl. No. 14/798,154 dated Jun. 1, 2018, 05 pages.
Quinley. M, et al., "High Voltage Nanosecond Pulser Operating at 30 kW and 400 kHz" APS-GEC-2018. Published Nov. 2018. Retrieved Jan. 24, 2020 <URL: https://www.eagleharbortech.com/ wp-content/uploads/2018/11/APS-GEC-2018-NSP-web.pdf> p. 1.
International Search Report and Written Opinion, as issued in connection with International Patent Application No. PCT/US2019/ 013988, dated Dec. 10, 2019, 5 pages.
International Search Report and Written Opinion, as issued in connection with International Patent Application No. PCT/US2018/ 016993, dated Apr. 18, 2018, 10 pages.
International Search Report and Written Opinion, as issued in connection with International Patent Application No. PCT/US2019/ 25440 dated Jun. 25, 2018, 25 pages.
Bland, M., et al., "A High Power RF Power Supply for High Energy Physics Applcations," Proceedings of the Particle Accelerator Conference, Knoxville, TN, May 16-20, 2005, pp. 4018-4020.
In, Y., et al., "On the roles of direct feedback and error field correction in stabilizing resistive-wall modes," Nuclear Fusion, 2010, retrieved from p:///stacks.iop.org/NF/50/042001 on Apr. 12, 2012, vol. 50, No. 4, 5 pages.
Kim, J., et al., "High Voltage Pulsed Power Supply Using IGBT Stacks," IEEE Transactions on Dielectrics and dectncal Insulation, Aug. 2007, vol. 14, No. 4, 926-926.
Locher, R., "Introduction to Power MOSFETs and their Applications {Application Note 558)," Fairchild Semiconductor, Oct. 1998, 15 pages.
Locher, R., et al., "Use of BiMOSFETs in Modem Radar Transmitters," IEEE International Conference on Power dectronics and Drive Systems, Indonesia, 2001, pp. 776-782.
Reass, W., et al., "Progress Towards a 20 KV, 2 KA Plasma Source Ion Implantation Modulator for Automotive Production of Diamond Film on Aluminum," Submitted to 22nd International Power Symposium, Boca Raton, FL, Jun. 24-27, 1996, 6 pages.
Scoville, J., et al., "The Resistive Wall Mode Feedback Control System on DIII-D," IEEE/NPSS 18th Symposium on rusion Engineering, Albuquerque, NM, Oct. 25-29, 1999, General Atomics Report GAA23256, Nov. 1999, 7 pages.
Zavadtsev, D., et al., "Compact Electron Linear Accelerator RELUS-5 for Radiation Technology Application," 1oth European Particle Accelerator Conference, Edinburgh, UK, Jun. 26-30, 2006, 3 pages.
International Search Report and Written Opinion mailed dated Sep. 15, 2014 as received in PCT Application No. PCT/US2014/04029.
International Search Report and Written Opinion dated Feb. 20, 2015 in related PCT application No. PCT/US2014/065832 (14 pages).
A. Starikovskiy and N. Aleksandrov, "Plasma-assisted ignition and combustion," Progress in Energy and Combustion Science, 39, 1, Feb. 2013, pp. 61-110.
Gaudet, J., et al, "Research Issues in Developing Compact Pulsed Power for High Peak Power Applications on Mobile Platforms," Proc. IEEE, 92, 7, Jun. 2004, pp. 1144-1165.
D. A. Singleton et al. "Compact Pulsed-Power System for Transient Plasma Ignition," IEEE Trans. Plasma Sci., 37, 12, Aug. 2009 pp. 2275-2279.
Wang, F., "Compact High Repetition Rate Pseudospark Pulse Generator," IEEE Trans. Plasma Sci., 33, 4, Aug. 2005 p. 1177-1181.
Singleton, D. R., "Low Energy Compact Power Modulators for Transient Plasma Ignition," IEEE Trans. Dielectr. Electr. nsul., 18, 4, Aug. 2011, pp. 1084-1090.
Rao, X., et al., "Combustion Dynamics of Plasma-Enhansed Premixed and Nonpremixed Flames," IEEE Trans. Plasma Sci., 38, 12, Nov. 2010 pp. 3265-3271.
Pokryvailo, A., et al, "A 1KW Pulsed Corona System for Pollution Control Applications." 14th IEEE International Pulsed Dower Conference, Dallas, TX, USA, Jun. 15-18, 2003.

(56) References Cited

OTHER PUBLICATIONS

Pokryvailo, A., et al, "High-Power Pulsed Corona for Treatment of Pollutants in Heterogeneous Media," IEEE Trans. Plasma Sci., 34, 5, Oct. 2006, pp. 1731-1743.
Dammertz, G., et al, "Development of Multimegawatt Gyrotrons for Fusion Plasma Heating and Current Drive," IEEE rans. Elec. Devices., 52, 5, Apr. 2005, pp. 808-817.
Thu, Z., et al, "High Voltage pulser with a fast fall-time for plasma immersion ion implantation," Review Sci Inst., 82, J45102,Apr. 2011.
Sanders, J., et al, "Scalable, Compact, Nanosecond Pulse Generation with a High Repetition Rate for Biomedical Applications Requiring Intense Electric Fields," Pulsed Power Conference, 2009. PPC '09. IEEE, Washington, DC, Jun. 28, 2009-Jul. 2, 2009.
Schamiloglu, E., et al, "Scanning the Technology: Modem Pulsed Power: Charlie Martin and Beyond," Proc. IEEE, 92, 7 , Jun. 2004, pp. 1014-1020.
Garwin, Richard, "Pulsed Power Peer Review Committee Report," Sandia National Laboratories Report, SAND2000-2515, Oct. 2000.
U.S. Non-Final Office Action in U.S. Appl. No. 14/542,487 dated Nov. 23, 2015, 11 pages.
International Search Report and Written Opinion dated Oct. 6, 2015 in related PCT application No. PCT/US2015/040204 (15 pages).
U.S. Office Action in U.S. Appl. No. 14/635,991, dated Jul. 29, 2016, 16 pgs.
U.S. Office Action in U.S. Appl. No. 14/635,991, dated Jan. 23, 2017, 21 pgs.
U.S. Notice of Allowance in U.S. Appl. No. 14/635,991, dated May 4, 2017, 7 pgs.
U.S. Office Action in U.S. Appl. No. 16/178,538 dated Jan. 11, 2019, 25 pgs.
U.S. Office Action in U.S. Appl. No. 15/941,731, dated Nov. 16, 2018, 15 pgs.
U.S. Office Action in U.S. Appl. No. 15/623,464, dated Nov. 7, 2017, 17 pgs.
U.S. Office Action in U.S. Appl. No. 15/623,464, dated Mar. 27, 2018, 18 pgs.
U.S. Notice of Allowance in U.S. Appl. No. 15/623,464, dated Oct. 17, 2018, 7 pgs.
U.S. Non-Final Office Action in U.S. Appl. No. 14/798,154 dated Jan. 5, 2016, 13 pages.
U.S. Office Action in U.S. Appl. No. 16/250,765, dated Mar. 29, 2019, 9 pgs.
International Search Report and Written Opinion, as issued in connection with International Patent Application No. PCT/US2019/43933, dated Oct. 25, 2019, 9 pgs.
U.S. Office Action in U.S. Appl. No. 16/250,157, dated Dec. 19, 2019, 5 pgs.
U.S. Final Office Action in U.S. Appl. No. 14/542,487 dated Feb. 12, 2016, 11 pages.
U.S. Non-Final Office Action in U.S. Appl. No. 14/542,487 dated Apr. 8, 2016, 12 pages.
U.S. Final Office Action in U.S. Appl. No. 14/798,154 dated Oct. 06, 2016, 14 pages.
U.S. Final Office Action in U.S. Appl. No. 14/542,487 dated Dec. 12, 2016, 13 pages.
U.S. Non-Final Office Action in U.S. Appl. No. 14/798,154 dated May 26, 2017, 16 pages.
U.S. Non-Final Office Action in U.S. Appl. No. 14/542,487 dated Jun. 5, 2017, 12 pages.

\* cited by examiner

NANOSECOND PULSER THERMAL MANAGEMENT

CROSS-REFERENCE TO RELATED APPLICATIONS

This application claims priority to U.S. Provisional Patent Application No. 62/711,464 filed Jul. 27, 2018, titled "NANOSECOND PULSER SYSTEM," which is incorporated by reference in its entirety.

This application claims priority to U.S. Provisional Patent Application No. 62/711,334 filed Jul. 27, 2018, titled "NANOSECOND PULSER THERMAL MANAGEMENT," which is incorporated by reference in its entirety.

This application claims priority to U.S. Provisional Patent Application No. 62/711,457 filed Jul. 27, 2018, titled "NANOSECOND PULSER PULSE GENERATION," which is incorporated by reference in its entirety.

This application claims priority to U.S. Provisional Patent Application No. 62/711,347 filed Jul. 27, 2018, titled "NANOSECOND PULSER ADC SYSTEM," which is incorporated by reference in its entirety.

This application claims priority to U.S. Provisional Patent Application No. 62/711,467 filed Jul. 27, 2018, titled "EDGE RING POWER SYSTEM," which is incorporated by reference in its entirety.

This application claims priority to U.S. Provisional Patent Application No. 62/711,406 filed Jul. 27, 2018, titled "NANOSECOND PULSER BIAS COMPENSATION," which is incorporated by reference in its entirety.

This application claims priority to U.S. Provisional Patent Application No. 62/711,468 filed Jul. 27, 2018, titled "NANOSECOND PULSER CONTROL MODULE," which is incorporated by reference in its entirety.

This application claims priority to U.S. Provisional Patent Application No. 62/711,523 filed Aug. 10, 2018, titled "PLASMA SHEATH CONTROL FOR RF PLASMA REACTORS," which is incorporated by reference in its entirety.

This application claims priority to U.S. Provisional Patent Application No. 62/789,523 filed Jan. 1, 2019, titled "EFFICIENT NANOSECOND PULSER WITH SOURCE AND SINK CAPABILITY FOR PLASMA CONTROL APPLICATIONS," which is incorporated by reference in its entirety.

This application claims priority to U.S. Provisional Patent Application No. 62/789,526 filed Jan. 1, 2019, titled "EFFICIENT ENERGY RECOVERY IN A NANOSECOND PULSER CIRCUIT," which is incorporated by reference in its entirety.

This application claims priority to and is a continuation-in-part of U.S. Non-Provisional patent application Ser. No. 16/523,840 filed Jul. 26, 2019, titled "NANOSECOND PULSER BIAS COMPENSATION," which is incorporated by reference in its entirety.

BACKGROUND

Producing high voltage pulses with fast rise times and/or fast fall times is challenging. For instance, to achieve a fast rise time and/or a fast fall time (e.g., less than about 50 ns) for a high voltage pulse (e.g., greater than about 2 kV), the slope of the pulse rise and/or fall must be incredibly steep (e.g., greater than $10^{11}$ V/s). Such steep rise times and/or fall times are very difficult to produce especially in circuits driving a load with low capacitance. Such pulse may be especially difficult to produce using standard electrical components in a compact manner; and/or with pulses having variable pulse widths, voltages, and repetition rates; and/or within applications having capacitive loads such as, for example, a plasma. In addition, high voltage systems, such as those producing high voltage pulses, can introduce leakage currents in the thermal management system or potential arcs between components.

SUMMARY

Some embodiments include a thermal management system for a nanosecond pulser. In some embodiments, a nanosecond pulser system may include a plurality of switches electrically coupled in parallel, each of the plurality of switches having a switch heat sink. In some embodiments, the nanosecond pulser system may include a transformer comprising: at least one transformer core that includes a first core surface; a plurality of primary windings electrically coupled with the plurality of switches; and a plurality of secondary windings. In some embodiments, the nanosecond pulser system may include an output electrically coupled with the plurality of secondary windings, the output providing pulses having a voltage greater than about 1 kV, a pulse width less than about 1 μs, and a pulse repetion frequency greater than about 20 kHz. In some embodiments, the nanosecond pulser system may include a thermal management system that may include at least one switch cold plate physically coupled with the first switch surface of at least a subset of the plurality of switches, the at least one switch cold plate comprising a metal. In some embodiments, the thermal management system may include a core cold plate physically coupled with the first core surface, the core cold plate comprising a metal.

In some embodiments, the stray capacitance between the switch cold plate and ground with the switch cold plate is less than 5 nF greater than the stray capacitance between a switch heat sink and ground with the switch cold plate removed.

In some embodiments, the stray capacitance between secondary winding and ground with the core cold plate is less than 5 nF greater than the stray capacitance between secondary winding and ground without the core cold plate.

In some embodiments, the stray inductance on the secondary side of the transformer with the core cold plate is less than 10 μH greater than the stray inductance on the secondary side of the transformer without the core cold plate.

In some embodiments, the stray inductance on the primary side of the transformer with the core cold plate is less than 10 nH greater than the stray inductance on the primary side of the transformer without the core cold plate.

In some embodiments, the switch cold plate and each switch heat sink are electrically coupled and have the same electric potential.

In some embodiments, the thermal management system may include an insulating material disposed between the switch cold plate and a heat sink.

In some embodiments, the thermal management system may include an insulating material disposed between the core cold plate and the transformer core, the plurality of primary windings, and the plurality of secondary windings. In some embodiments, the insulating material has a thickness greater than about 0.01 mm.

In some embodiments, the thermal management system may include a plurality of tubes coupled with the core cold plate and the switch cold plate; and a fluid that flows through the plurality tubes. In some embodiments, the fluid comprises a di-electric fluid, Galden, Coolanol, or water.

In some embodiments, the thermal management system may include one or more fans positioned to allow a gas to circulate near the switch cold plate and the core cold plate.

In some embodiments, the nanosecond pulser system may include a nanosecond pulser enclosure within which the plurality of switches, the transformer, switch cold plate, and the transformer core cold plate are disposed; and an inert gas subsystem disposed within the nanosecond pulser enclosure that releases an inert gas into the nanosecond pulser enclosure with a pressure greater than atmospheric pressure.

In some embodiments, the transformer comprises a second transformer core, and the core cold plate is disposed between the transformer core and the second transformer core.

Some embodiments include a thermal management system for a nanosecond pulser. In some embodiments, the thermal management system may include a switch cold plate coupled with switches, a core cold plate coupled with one or more transformers, resistor cold plates coupled with resistors, or tubing coupled with the switch cold plates, the core cold plates, and the resistor cold plates. The thermal management system may include a heat exchanger coupled with the resistor cold plates, the core cold plate, the switch cold plate, and the tubing. The heat exchanger may also be coupled with a facility fluid supply.

Some embodiments of the invention may include a nanosecond pulser system comprising at least one or more of the following: a plurality of switches; a plurality of resistors electrically coupled with plurality of switches; a plurality of transformer cores electrically coupled with plurality of switches and/or the plurality of resistors; a plurality of switch cold plates in contact with the plurality of switches; a plurality of resistor cold plates in contact with the plurality of resistors; a plurality of core cold plates in contact with the plurality of transformer cores; a plurality of tubes coupling the plurality of switch cold plates, the plurality of core cold plates, and the plurality of resistor cold plates; and a fluid disposed within the plurality of tubes that flows within the tubes, the plurality of resistor cold plates, the plurality of core cold plates, and the plurality of switch cold plates.

In some embodiments, the nanosecond pulser system may include one or more manifolds, one or more pumps, one or more heat exchangers, and/or one or more fluid reservoirs.

In some embodiments, a nanosecond pulser system may include a plurality of switches arranged axially around a central point and a plurality of switch cold plates. A thermal management system comprising a plurality of switch cold plates having a substantially flat surface, each of the substantially flat surfaces of the plurality of switch cold plates physically coupled with a corresponding one of the plurality of switches and the plurality of switch cold plates are arranged axially around the central point. In some embodiments, the thermal management system may also include a tube physically coupled with each of the plurality of switch cold plates; and an inlet connector and an outlet connector coupled with the tube. In some embodiments, a dielectric fluid (or water) can flow through the inlet connector, into the tube, and out the outlet connector.

In some embodiments, each of the plurality of switch cold plates have a back surface opposite the substantially flat surface, the back surface having a groove and the tube is disposed within the groove.

In some embodiments, the thermal management system may include a first tube physically coupled with a subset of the plurality of switch cold plates; and a second tube physically coupled with a subset of the plurality of switch cold plates.

In some embodiments, each of the plurality of switch cold plates have a back surface opposite the substantially flat surface, the back surface having a first groove and a second groove, wherein the first tube is disposed within the first groove and the second tube is disposed within the second groove.

In some embodiments, the thermal management system may include an inlet/outlet manifold coupled with the first tube, the second tube, the inlet connector, and the outlet connector such that system fluid flows into the inlet connector through the inlet/outlet manifold to both the first tube and the second tube and through the inlet/outlet manifold out the outlet connector.

In some embodiments, the thermal management system may include a loop back manifold coupled with the first tube and the second tube. In some embodiments, the thermal management system may include a thermal interface material disposed between the plurality of switch cold plates and the plurality of switches. In some embodiments, the thermal management system may include a thermal interface material disposed between the plurality of switch cold plates and the tube.

In some embodiments, the thermal management system may include a heat exchanger coupled with the inlet connector and the outlet connector, the heat exchanger also including a facility fluid inlet and a facility fluid outlet.

Some embodiments include a nanosecond pulser system comprising a core cold plate and a transformer. In some embodiments, the core cold plate may include a top surface; a bottom surface; an internal tube comprising a ring with an aperture, an outer circumference, and having a first end and a second end; an inlet connector coupled with the first end of the internal tube; an outlet connector coupled with the second end of the internal tube; an inner ring disposed within the aperture of the internal tube; and an outer ring disposed outside of the outer circumference of the internal tube. In some embodiments, the transformer may include a transformer core having a toroid shape with a top surface, a bottom surface, and a transformer hole that passes through the middle of the transformer core, wherein either the bottom surface or the top surface of the transformer core is coupled with the top surface of the core cold plate; primary windings wound around the transformer core; and secondary windings wound around the transformer core.

In some embodiments, the aperture of the internal tube and the transformer hole are substantially aligned.

In some embodiments, the nanosecond pulser system may include a second transformer comprising a second transformer core having a toroid shape with a second top surface, a second bottom surface, and a second hole that passes through the middle of the second transformer core, wherein either the second bottom surface or the second top surface of the second transformer core is coupled with the bottom surface of the core cold plate; primary windings wound around the transformer core; and secondary windings wound around the transformer core.

In some embodiments, either or both the inner ring and the outer ring comprise an insulating material.

In some embodiments, a dielectric fluid flows through an inlet connector coupled with the first end of the internal tube, the internal tube, and out an outlet connector coupled with the second end of the internal tube.

In some embodiments, the nanosecond pulser system may include a thermal management system that may include a heat exchanger coupled with the inlet connector and the outlet connector, the heat exchanger also including a facility fluid inlet and a facility fluid outlet. In some embodiments the thermal management system may include a flat ring within which the internal tube is disposed.

Some embodiments include a pulser system comprising a nanosecond pulser system and a thermal management system. In some embodiments, the nanosecond pulser system may include a plurality of switches; a transformer electrically coupled with the plurality of switches; a plurality of resistors electrically coupled with the transformer; and an output coupled with the plurality of resistors and/or the transformer, the output providing pulses with a voltage greater than 2 kV and frequencies greater than 1 kHz. In some embodiments, the thermal management system includes a heat exchanger, a plurality of switch cold plates coupled with the plurality switches; a core cold plate coupled with the transformer; a plurality of resistor cold plates coupled with the plurality of resistors; tubing coupled with the plurality of switch cold plates, the core cold plate, and the plurality of resistor cold plates; and a pump. The heat exchanger may include a facility fluid inlet port; a facility fluid outlet port fluidically coupled with the facility fluid inlet port; a dielectric fluid inlet port; and a dielectric fluid outlet port fluidically coupled with the dielectric fluid inlet port. The pump may be coupled with the dielectric fluid outlet port, the dielectric fluid inlet port, and configured to pump dielectric fluid through the tubing and one or more of the plurality of switch cold plates, the core cold plate, and the plurality of resistor cold plates.

In some embodiments, the thermal management system may include a nitrogen purge system that pumps nitrogen into the nanosecond pulser system.

In some embodiments, the thermal management system may include a main manifold coupled with the plurality of switch cold plates, the core cold plate, and the plurality of resistor cold plates.

In some embodiments, the thermal management system may include one or more sensors selected from the group consisting of pressure sensors, a heat sensor, a liquid level sensor, and a flow meter.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Systems and methods are disclosed to provide thermal management to a high voltage nanosecond pulser system. In some embodiments, a high voltage nanosecond pulser system may pulse voltages with amplitudes of about 10 kV to about 40 kV with frequencies up to about 500 kHz or 2 MHz. In some embodiments, a high voltage nanosecond pulser system may provide single pulses of varying pulse widths from about 20 nanoseconds to about 1 microsecond. In some embodiments, a high voltage nanosecond pulser system may switch at frequencies greater than about 10 kHz. In some embodiments, a high voltage nanosecond pulser system may operate with rise times less than about 20 ns.

Because of the high voltage, high voltage nanosecond pulser systems consume a lot of power (e.g., about 1 kW), which can generate a lot of heat (e.g., about 500 W to about 80 kW). In addition, high voltage nanosecond pulser systems may have unique geometries or unique components. A number of cooling techniques are disclosed that may be used with a high voltage nanosecond pulser system.

Figure 1A:
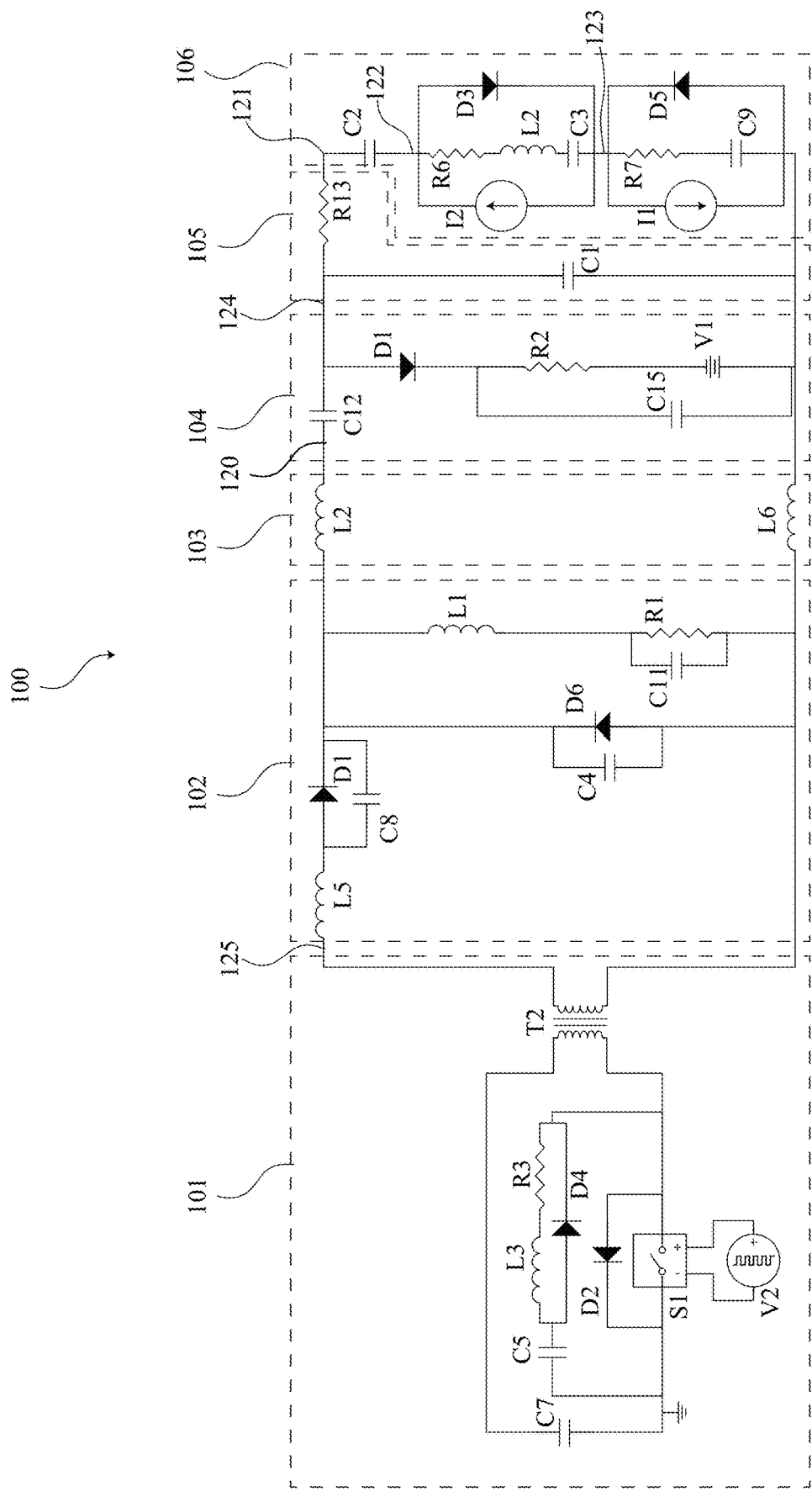
FIG. 1A is a circuit diagram of a nanosecond pulser according to some embodiments.

FIG. 1A is a circuit diagram of a nanosecond pulser system 100 according to some embodiments. The nanosecond pulser system 100 can be implemented within a high voltage nanosecond pulser system. The nanosecond pulser system 100 can be generalized into five stages (these stages could be broken down into other stages or generalized into fewer stages and/or may or may not include the components shown in the figure). The nanosecond pulser system 100 includes a pulser and transformer stage 101, a resistive output stage 102, a lead stage 103, a DC bias compensation circuit 104, and a load stage 106.

In some embodiments, the nanosecond pulser system 100 can produce pulses from the power supply with voltages greater than 2 kV, with rise times less than about 20 ns, and frequencies greater than about 10 kHz.

In some embodiments, the pulser and transformer stage 101 can produce a plurality of high voltage pulses with a high frequency and fast rise times and fall times. In all of the circuits shown, the high voltage pulser may comprise a nanosecond pulser.

In some embodiments, the pulser and transformer stage 101 can include one or more solid state switches S1 (e.g., solid state switches such as, for example, IGBTs, a MOSFETs, a SiC MOSFETs, SiC junction transistors, FETs, SiC switches, GaN switches, photoconductive switches, etc.), one or more snubber resistors R3, one or more snubber diodes D4, one or more snubber capacitors C5, and/or one or more freewheeling diodes D2. One or more switches and or circuits can be arranged in parallel or series.

In some embodiments, the load stage 106 may represent an effective circuit for a plasma deposition system, plasma etch system, or plasma sputtering system. The capacitance C2 may represent the capacitance of the dielectric material upon which a wafer may sit or capacitance C2 may represent the capacitance between an electrode and a wafer which are separated by a dielectric material. The capacitor C3 may represent the sheath capacitance of the plasma to the wafer. The capacitor C9 may represent capacitance within the plasma between a chamber wall and the top surface of the wafer. The current source I2 and the current source I1 may represent the ion current through the plasma sheaths.

In some embodiments, the resistive output stage 102 may include one or more inductive elements represented by inductor L1 and/or inductor L5. The inductor L5, for example, may represent the stray inductance of the leads in the resistive output stage 102. Inductor L1 may be set to minimize the power that flows directly from the pulser and transformer stage 101 into resistor R1.

In some embodiments, the resistor R1 may dissipate charge from the load stage 106, for example, on fast time scales (e.g., 1 ns, 10 ns, 50 ns, 100 ns, 250 ns, 500 ns, 1,000 ns, etc. time scales). The resistance of resistor R1 may be low to ensure the pulse across the load stage 106 has a fast fall time $t_f$.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 5 nF, 2 nF, 1 nF, 500 pF, 250 pF, 100 pF, 50 pF, 10 pF, 1 pF, etc. The capacitance of stray capacitance C11, for example, may be less than the load capacitance such as, for example, less than the capacitance of C2, C3, and/or C9.

In some embodiments, a plurality of pulser and transformer stages 101 can be arranged in parallel and coupled with the resistive output stage 102 across the inductor L1 and/or the resistor R1. Each of the plurality of pulser and transformer stages 101 may each also include diode D1 and/or diode D6.

In some embodiments, the capacitor C8 may represent the stray capacitance of the blocking diode D1. In some embodiments, the capacitor C4 may represent the stray capacitance of the diode D6.

In some embodiments, the DC bias compensation circuit 104 may include a DC voltage source V1 that can be used to bias the output voltage either positively or negatively. In some embodiments, the capacitor C12 isolates/separates the DC bias voltage from the resistive output stage and other circuit elements. It allows for a potential shift from one portion of the circuit to another. In some applications the potential shift it establishes is used to hold a wafer in place. Resistance R2 may protect/isolate the DC bias supply from the high voltage pulsed output from the pulser and transformer stage 101.

In this example, the DC bias compensation circuit 104 is a passive bias compensation circuit and can include a bias compensation diode D1 and a bias compensation capacitor C15. The bias compensation diode C15 can be arranged in series with offset supply voltage V1. The bias compensation capacitor C15 can be arranged across either or both the offset supply voltage V1 and the resistor R2. The bias compensation capacitor C15 can have a capacitance less than 100 nH to 100 µF such as, for example, about 100 µF, 50 µF, 25 µF, 10 µF, 2 µ, 500 nH, 200 nH, etc.

In some embodiments, the bias capacitor C12 may allow for a voltage offset between the output of the pulser and transformer stage 101 (e.g., at the position labeled 125) and the voltage on the electrode (e.g., at the position labeled 124). In operation, the electrode may, for example, be at a DC voltage of −2 kV during a burst, while the output of the nanosecond pulser alternates between +6 kV during pulses and 0 kV between pulses.

The bias capacitor C12, for example, 100 nF, 10 nF, 1 nF, 100 µF, 10 µF, 1 µF, etc. The resistor R2, for example, may have a high resistance such as, for example, a resistance of about 1 kOhm, 10 kOhm, 100 kOhm, 1 MOhm, 10 MOhm, 100 MOhm, etc.

In some embodiments, the bias compensation capacitor C15 and the bias compensation diode D1 may allow for the voltage offset between the output of the pulser and transformer stage 101 (e.g., at the position labeled 125) and the voltage on the electrode (e.g., at the position labeled 124) to be established at the beginning of each burst, reaching the needed equilibrium state. For example, charge is transferred from bias capacitor C12 into bias compensation capacitor C15 at the beginning of each burst, over the course of a plurality of pulses (e.g., about 5-100 pulses), establishing the correct voltages in the circuit.

In some embodiments, the DC bias compensation circuit 104 may include one or more high voltage switches placed across the bias compensation diode D1 and coupled with the power supply V1. In some embodiments, a high voltage switch may include a plurality of switches arranged in series to collectively open and close high voltages.

A high voltage switch may be coupled in series with either or both an inductor and a resistor. The inductor may limit peak current through high voltage switch. The inductor, for example, may have an inductance less than about 100 µH such as, for example, about 250 µH, 100 µH, 50 µH, 25 µH, 10 µH, 5 µH, 1 µH, etc. The resistor, for example, may shift power dissipation to the resistive output stage 102. The resistance of resistor may have a resistance of less than about 1,000 ohms, 500 ohms, 250 ohms, 100 ohms, 50 ohms, 10 ohms, etc.

In some embodiments, a high voltage switch may include a snubber circuit.

In some embodiments, the high voltage switch may include a plurality of switches arranged in series to collectively open and close high voltages. For example, the high voltage switch may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, a high voltage switch may be open while the pulser and transformer stage 101 is pulsing and closed when the pulser and transformer stage 101 is not pulsing. When the high voltage switch is closed, for example, current can short across the bias compensation diode C15. Shorting this current may allow the bias between the wafer and the chuck to be less than 2 kV, which may be within acceptable tolerances.

In some embodiments, the pulser and transformer stage 101 can produce pulses having a high pulse voltage (e.g., voltages greater than 1 kV, 10 kV, 20 kV, 50 kV, 100 kV, etc.), high pulse repetition frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

Figure 1B:
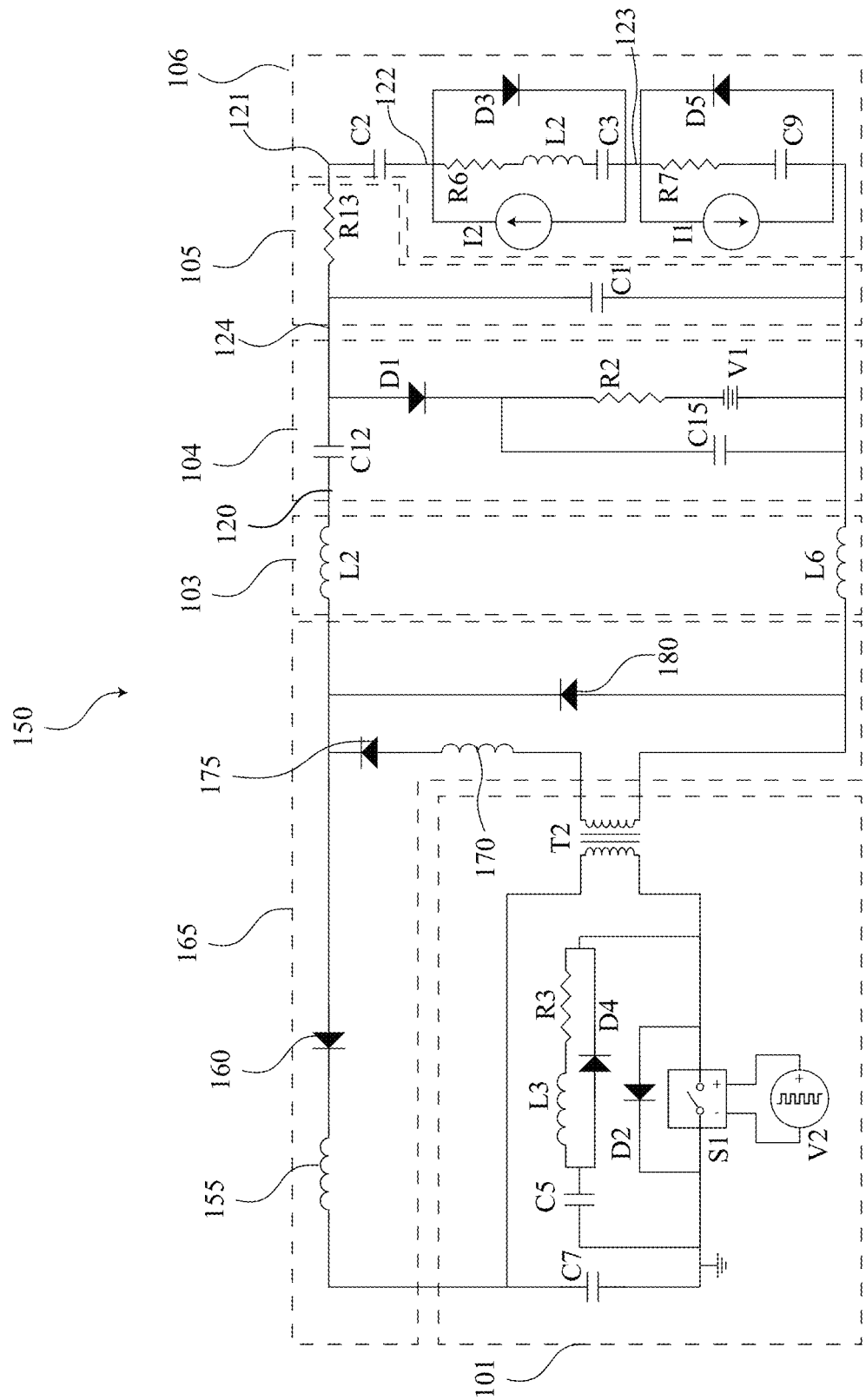
FIG. 1B is a circuit diagram of a nanosecond pulser system with a pulser and transformer stage and an energy recovery circuit according to some embodiments.

FIG. 1B is a circuit diagram of a nanosecond pulser system 150 with the pulser and transformer stage 101 and an energy recovery circuit 165 according to some embodiments. The energy recovery circuit, for example, may replace the resistive output stage 102 shown in FIG. 1. In this example, the energy recovery circuit 165 may be positioned on or electrically coupled with the secondary side of the transformer T1. The energy recovery circuit 165, for example, may include a diode 180 (e.g., a crowbar diode) across the secondary side of the transformer T1. The energy recovery circuit 165, for example, may include diode 160 and inductor 155 (arranged in series), which can allow current to flow from the secondary side of the transformer T1 to charge the power supply C7. The diode 160 and the inductor 155 may be electrically connected with the secondary side of the transformer T1 and the power supply C7. In some embodiments, the energy recovery circuit 165 may include diode 175 and/or inductor 170 electrically coupled with the secondary of the transformer T1. The inductor 170 may represent the stray inductance and/or may include the stray inductance of the transformer T1.

When the nanosecond pulser is turned on, current may charge the load stage 106 (e.g., charge the capacitor C3, capacitor C2, or capacitor C9). Some current, for example, may flow through inductor 155 when the voltage on the secondary side of the transformer T1 rises above the charge voltage on the power supply C7. When the nanosecond pulser is turned off, current may flow from the capacitors within the load stage 106 through the inductor 155 to charge the power supply C7 until the voltage across the inductor 155 is zero. The diode 180 may prevent the capacitors within the load stage 106 from ringing with the inductance in the load stage 106 or the dc bias power supply stage 104.

The diode 160 may, for example, prevent charge from flowing from the power supply C7 to the capacitors within the load stage 106.

The value of inductor 155 can be selected to control the current fall time. In some embodiments, the inductor 155 can have an inductance value between 1 µH-500 µH.

In some embodiments, the energy recovery circuit 165 may include an energy recovery switch that can be used to control the flow of current through the inductor 155. The energy recovery switch, for example, may be placed in series with the inductor 155. In some embodiments, the energy recovery switch may be closed when the switch S1 is open and/or no longer pulsing to allow current to flow from the load stage 106 back to the high voltage load C7.

In some embodiments, the energy recovery switch may include a plurality of switches arranged in series to collectively open and close high voltages. For example, the energy recovery switch may, for example, include any switch described in U.S. patent application Ser. No. 16/178,565, filed Nov. 1, 2018, titled "High Voltage Switch with Isolated Power," which is incorporated into this disclosure in its entirety for all purposes.

Figure 2:
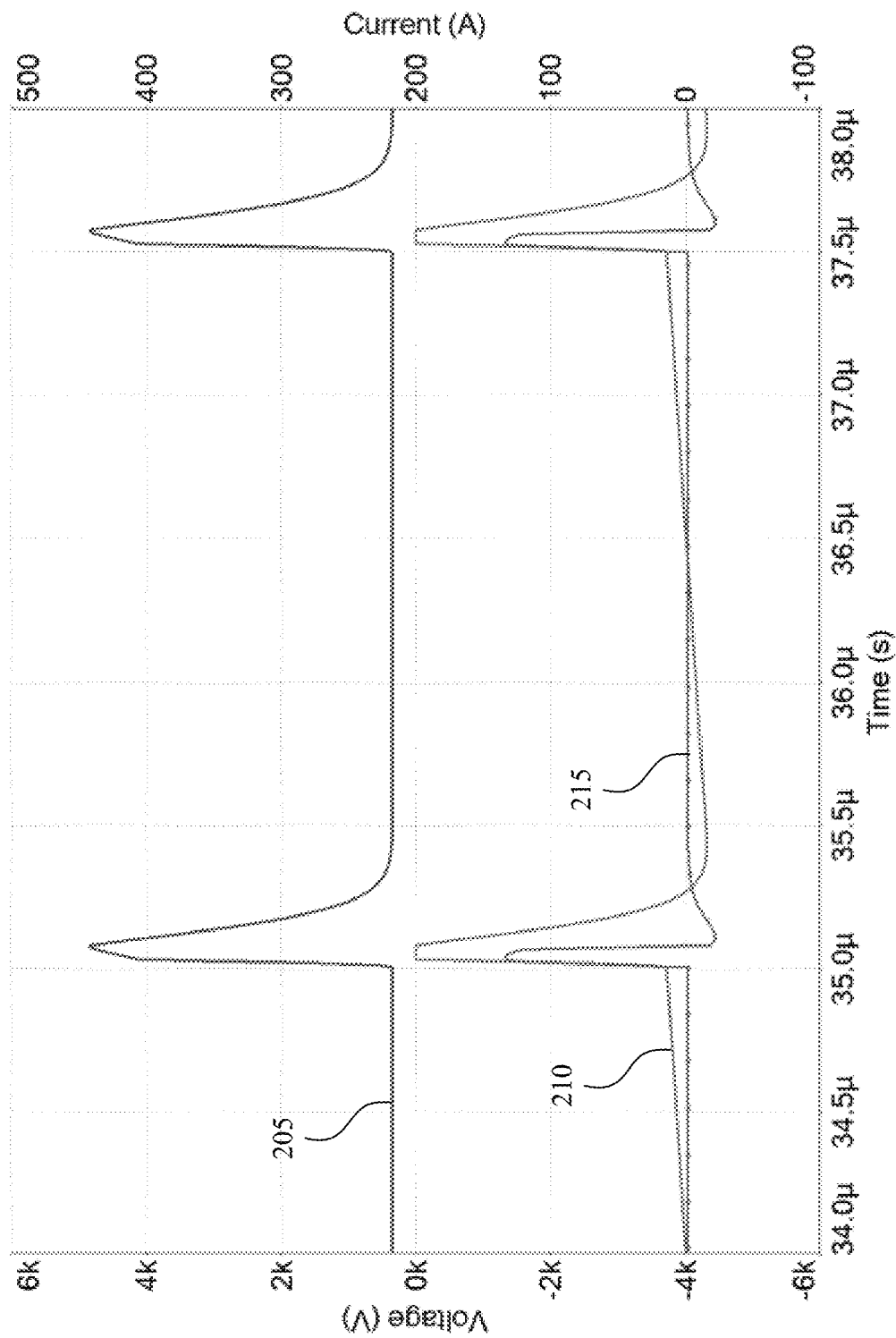
FIG. 2 shows example waveforms produced by the nanosecond pulser.

In some embodiments, the nanosecond pulser system 150 may produce similar waveforms as those shown in FIG. 2.

FIG. 2 shows example waveforms produced by the nanosecond pulser system 100. Similar waveforms can be produced by the nanosecond pulser system 150. In these example waveforms, the pulse waveform 205 may represent the voltage provided by the pulser and transformer stage 101. As shown, the pulse waveform 205 produces a pulse with the following qualities: high voltage (e.g., greater than about 4 kV as shown in the waveform), a fast rise time (e.g., less than about 200 ns as shown in the waveform), a fast fall time (e.g., less than about 200 ns as shown in the waveform), and short pulse width (e.g., less than about 300 ns as shown in the waveform). The waveform 210 may represent the voltage at the surface of a wafer represented in the circuit of the nanosecond pulser system 100 by the point between capacitor C2 and capacitor C3 or the voltage across capacitor C3. The pulse waveform 215 represent the current flowing from the pulser and transformer stage 101 to the plasma. The circuit may or may not include either or both diodes D1 or D2.

During the transient state (e.g., during an initial number of pulses not shown in the figure), the high voltage pulses from the pulser and transformer stage 101 charge the capacitor C2. Because the capacitance of capacitor C2 is large compared to the capacitance of capacitor C3 and/or capacitor C1, and and/or because of the short pulse widths of the pulses, the capacitor C2 may take a number of pulses from the high voltage pulser to fully charge. Once the capacitor C2 is charged the circuit reaches a steady state, as shown by the waveforms in FIG. 2.

In steady state and when the switch S1 is open, the capacitor C2 is charged and slowly dissipates through the resistive output stage 102, as shown by the slightly rising slope of waveform 210. Once the capacitor C2 is charged and while the switch S1 is open, the voltage at the surface of the waver (the point between capacitor C2 and capacitor C3) is negative. This negative voltage may be the negative value of the voltage of the pulses provided by the pulser and transformer stage 101. For the example waveform shown in FIG. 2, the voltage of each pulse is about 4 kV; and the steady state voltage at the wafer is about −4 kV. This results in a negative potential across the plasma (e.g., across capacitor C3) that accelerates positive ions from the plasma to the surface of the wafer. While the switch S1 is open, the charge on capacitor C2 slowly dissipates through the resistive output stage.

When the switch S1 is closed, the voltage across the capacitor C2 may flip (the pulse from the pulser is high as shown in pulse waveform 205) as the capacitor C2 is charged. In addition, the voltage at the point between capacitor C2 and capacitor C3 (e.g., at the surface of the wafer) changes to about zero as the capacitor C2 charges, as shown in waveform 210. Thus, the pulses from the high voltage pulser produce a plasma potential (e.g., a potential in a plasma) that rise from a negative high voltage to zero and returns to the negative high voltage at high frequencies, with fast rise times, fast fall times, and/or short pulse widths.

In some embodiments, the action of the resistive output stage, elements represented by the resistive output stage 102, that may rapidly discharge the stray capacitance C1, and may allow the voltage at the point between capacitor C2 and capacitor C3 to rapidly return to its steady negative value of about −4 kV as shown by waveform 210. The resistive output stage may allow the voltage at the point between capacitor C2 and capacitor C3 to exists for about % of the time, and thus maximizes the time which ions are accelerated into the wafer. In some embodiments, the components contained within the resistive output stage may be specifically selected to optimize the time during which the ions are accelerated into the wafer, and to hold the voltage during this time approximately constant. Thus, for example, a short pulse with fast rise time and a fast fall time may be useful, so there can be a long period of fairly uniform negative potential.

Various other waveforms may be produced by the nanosecond pulser system 100.

In some embodiments, the major power dissipating components can include one or more resistive output stage resistors (e.g., about 16 kW or more of power dissipation for a series of resistive output stage resistors) such as, for example, represented by resistor R1 in FIG. 1; snubber resistors (e.g., 3 kW or more of power dissipation) such as, for example, resistors represented by resistor R3; one or more switches (3.2 kW or more of power dissipation) such as, for example, the switches represented by S1; and/or the transformer core (e.g., at least 800 W of power dissipation) such as, for example, the transformer represented by T1.

Some embodiments may include a thermal management system that can be used to remove heat from the high voltage nanosecond pulser system.

In some embodiments, the thermal management system may include a pump, one or more cold plates (e.g., switch cold plates, core cold plates, resistor cold plates), a main manifold, a heat exchanger, a reservoir, and/or fans/extra heat exchangers. For example, the switch cold plates may be coupled with the one or more switches S1. As another example, the core fold plates may be coupled with the transformer T1. As another example, the resistor cold plates may be coupled with the snubber resistors R3 and/or the resistive output stage resistors R1.

In some embodiments, a decoupled thermal management system may be implemented. One side of the thermal management system may be considered the hot side that may include the system fluid that conducts heat from active components, and the other side may include a cold side that may include facility fluid that conducts heat from the system fluid. In a decoupled thermal management system, the cooling medium flowing within the high voltage nanosecond pulser system near the electronic components does not include the facility fluid. Thus, for example, may allow the facility fluid to have any type of water quality or any number of contaminants without degrading system performance. In some embodiments, the facility fluid may comprise water.

In some embodiments, a thermal management system may include a system fluid as a heat exchange medium. The system fluid, for example, may comprise a dielectric fluid, which may allow electrical components to be cooled without leakage currents conducted through the system fluid. A dielectric fluid, for example, may prevent current or voltage arcs or shorts forming in the system fluid.

In some embodiments, only the high voltage components may be cooled by the system fluid (not facility fluid) while lower voltage components may be cooled by facility fluid. In some embodiments, the system fluid may include water and the system may comprise an internal water deionizer that deionizes the water to cool components.

In some embodiments, all or some of the components may be cooled with facility fluid.

Figure 3:
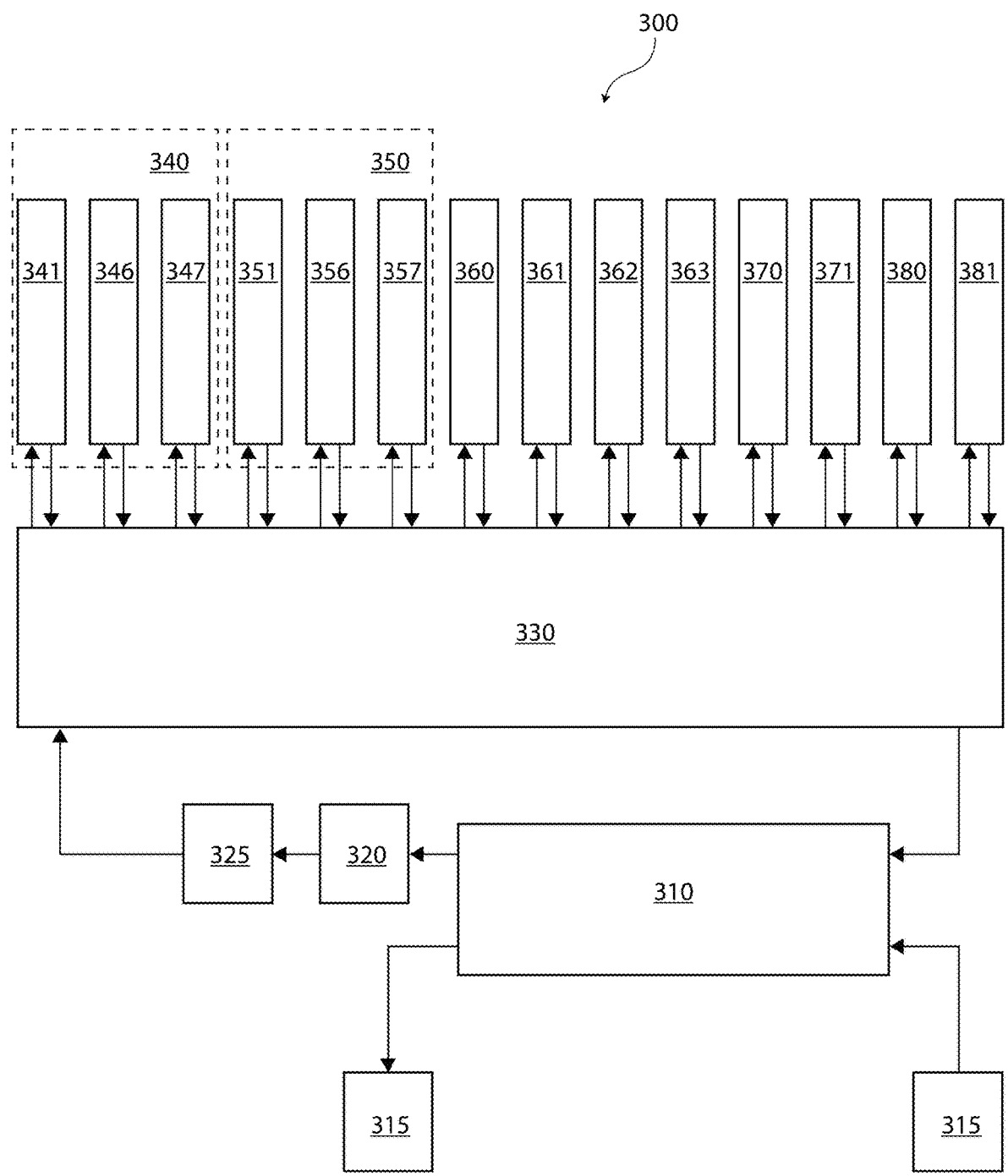
FIG. 3 is a block diagram of the thermal management system according to some embodiments.

FIG. 3 is a block diagram of the thermal management system 300 according to some embodiments. In some embodiments, the thermal management system 300 may include a main manifold 305 and a heat exchanger 310. The heat exchanger 310 may exchange heat between the cold side and the hot side of the thermal management system. The hot side may be fluidically coupled with any number of cold plates such that hot system fluid returned from the cold plates may be cooled by facility fluid within the heat exchanger 310. In some embodiments, system fluid may include water, dielectric fluid, dielectric fluid Galden HT110, deionized water, glycol/water solutions, aromatic based dielectric fluids (e.g., DEB), silicate-ester based dielectric fluids (e.g., as Coolanol 25R), aliphatic based dielectric fluids (e.g., PAO), silicone based dielectric fluids (e.g., Syltherm XLT), fluorocarbon based dielectric fluids (e.g., FC-77), ethylene glycol, propylene glycol, methanol/water, potassium formate/acetate solutions, etc. In some embodiments, the facility fluid may include water such as, for example, tap water.

In some embodiments, the facility side of the heat exchanger 310 may receive facility fluid (e.g., water) from an external fluid source 315. In some embodiments, the external fluid source 315 may include a fluid inlet and a fluid outlet. In some embodiments, the external fluid source 315 may include a facility fluid thermal management system. In some embodiments, the external fluid source may include one or more pumps to ensure facility fluid is flowing through the external fluid source including the heat exchanger 310.

In some embodiments, the heat exchanger 310, for example, may exchange heat from a hot side (e.g., various board components) to a cold side (e.g., a facility). In some embodiments, the cold side may include a facility fluid (e.g., water) and the hot side may include a system fluid (e.g., dielectric fluid). In some embodiments, the hot side may include one or more switch cold plates 341, 351, one or more core cold plates 346, 347, 356, 357, one or more resistor cold plates 360, 361, 362, 363, snubber resistor cold plate 370, 371, one or more liquid to air heat exchangers 380, 381, a pump 325, and/or a reservoir 320, etc. The hot side may be a fully contained system. The cold side may be coupled with an external fluid supply and/or a thermal management system. In some embodiments, the system fluid may be circulated faster than the facility fluid (e.g., twice as fast). In some embodiments, the system fluid may flow at a rate of about 1 to 100 gallons per minute or the facility fluid may flow at a rate of about 1 to 100 gallons per minute. In some embodiments, the heat exchanger 310 may facilitate heat exchange between the hot side and the cold side without transferring fluid between the hot side and the cold side.

In some embodiments, the hot side of the heat exchanger 310 may be coupled with the cold plates, the reservoir 320, the pump 325, or the main manifold 330 such as, for example, via one more pipes or tubes.

In some embodiments, the heat exchanger 310 may include a scalable plate heat exchanger. In some embodiments, the heat exchanger 310 may include a shell and tube heat exchanger. In some embodiments, the heat exchanger 310 may include a double pipe heat exchanger.

In some embodiments, the reservoir 320 may allow for expansion or contraction of the system fluid as the various components of the high voltage nanosecond pulser system heat up under operation. In some embodiments, the reservoir 320 may store excess system fluid to keep the pump 325 from potentially running dry. In some embodiments, the reservoir 320 may be constructed in any number of ways such as, for example, as a welded steel container or a polymer container. In some embodiments, the reservoir 320 may have a customized shape that can be sized or shaped to fit in any configuration or space. In some embodiments, the reservoir 320 may have an opening on the top of the reservoir 320 to allow the reservoir 320 to be filled with additional system fluid. In some embodiments, the reservoir 320 may include a pressure relief valve that can automatically open or close to allow pressure from within the reservoir to escape. In some embodiments, the reservoir 320 may include multiple chambers or compartments that may be useful to separate bubbles or reduce disturbances in the flow of the system fluid.

In some embodiments, the pump 325 may pump system fluid through the heat exchanger 310, the reservoir 320, the main manifold 330, tubes, pipes, or other components. The pump 325, for example, may pump the system fluid with a flow rate of about 10-30 gallons per minute or about 15-20 gallons per minute. In some embodiments, the pump may pump the system fluid with a flow rate of about 18 gallons per minute. In some embodiments, the pump 325 may comprise a magnetic drive pump, centrifugal pump, regenerative turbine pump, mechanical seal pump, etc. In some embodiments, the pump 325 may include a variable frequency drive motor pump or a conventional single speed centrifugal pump. In some embodiments, the pump may be wired so that the pump turns on automatically when the entire system it powered on.

Figure 4:
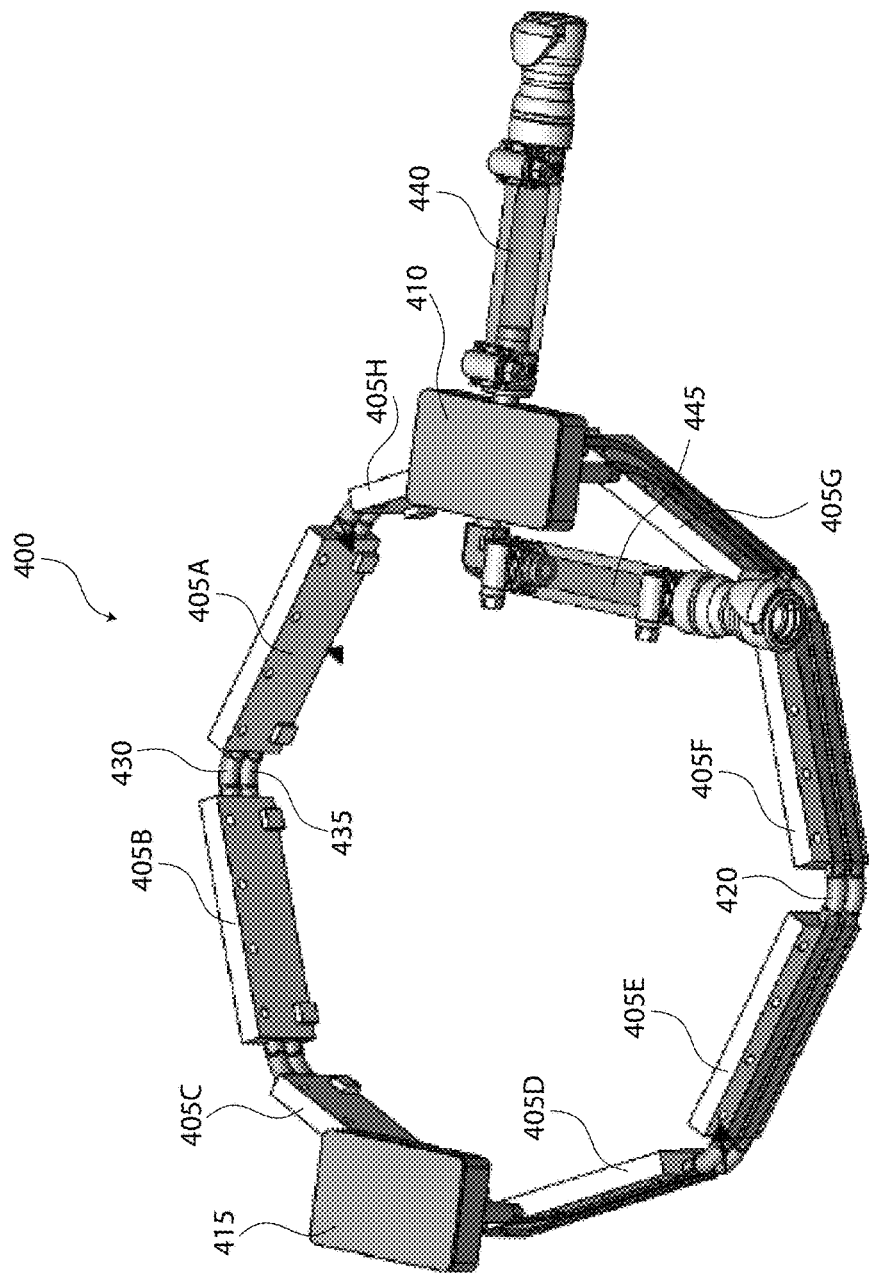
FIG. 4 illustrates an arrangement of a plurality of switch cold plates according to some embodiments.
Figure 5:
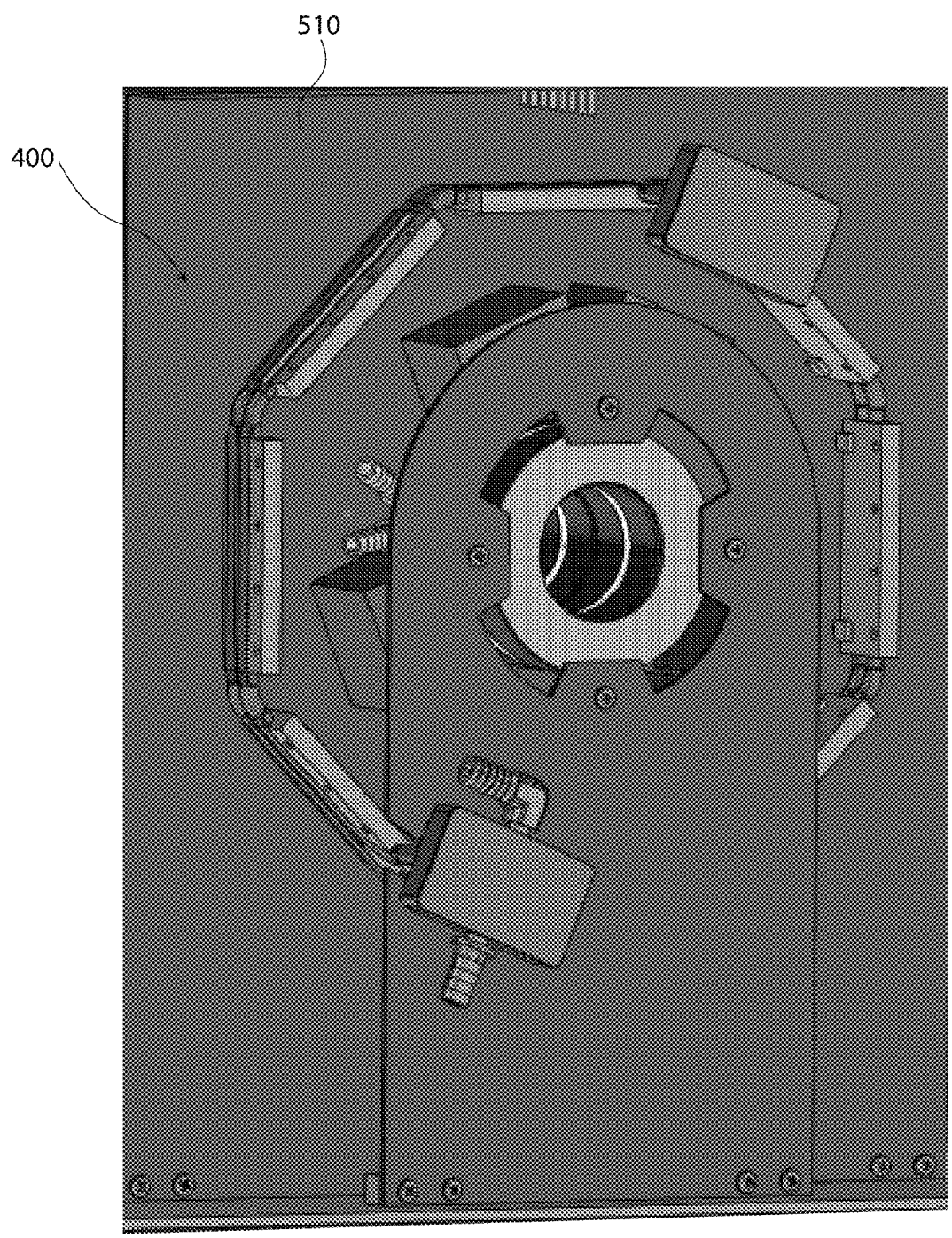
FIG. 5 illustrates an arrangement of a plurality of switch cold plates according to some embodiments.
Figure 6:
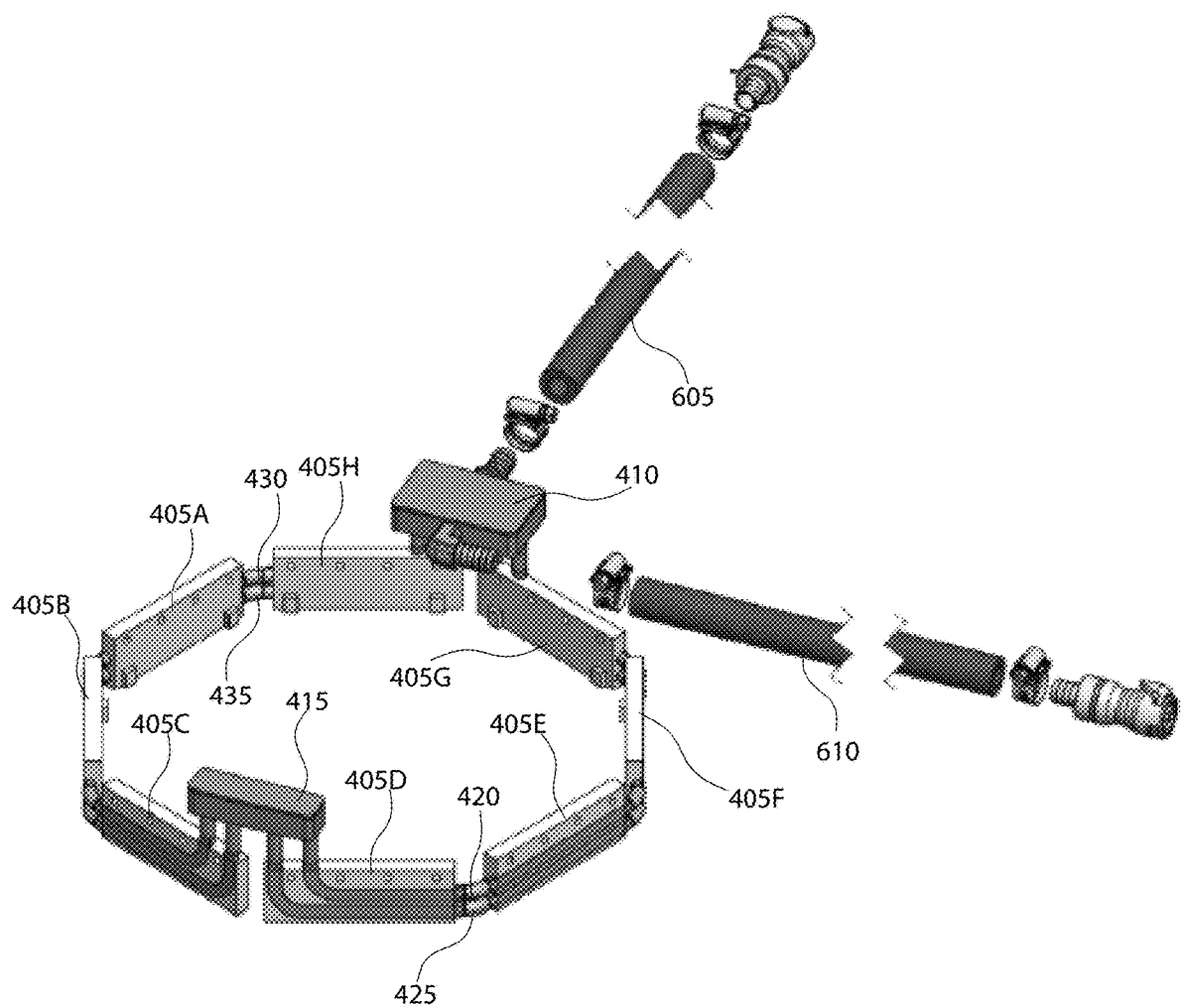
FIG. 6 illustrates an arrangement of a plurality of switch cold plates according to some embodiments.

In some embodiments, the main manifold 330 may distribute system fluid among any number of cold plates. For example, the cold plates can include one or more switch cold plates 341, 351. Examples of switch cold plates are shown in FIGS. 4, 5, and 6. For example, the cold plates can include one or more core cold plates 346, 347, 356, 357. Examples of core cold plates are shown in FIGS. 7, 8, 9, and 10.

In some embodiments, the core cold plates can interface with a toroid transformer core to provide optimal cooling while minimizing the impact on transformer performance. In some embodiments, the core cold plates may include inner or outer insulating rings so that a continuous conductive sheet primary winding of the transformer can be insulated from the core cold plate. In some embodiments, a core cold plate can be made of either a tube press fit into an aluminum ring or a larger diameter copper tube can be flattened into a ring shape so that there are less materials interacting. As another example, the core cold plate can be made from a solid piece of copper with a groove machined out of the inside to create an internal "tube" where then another piece of metal such as copper is then brazed on to the top.

Figure 11:
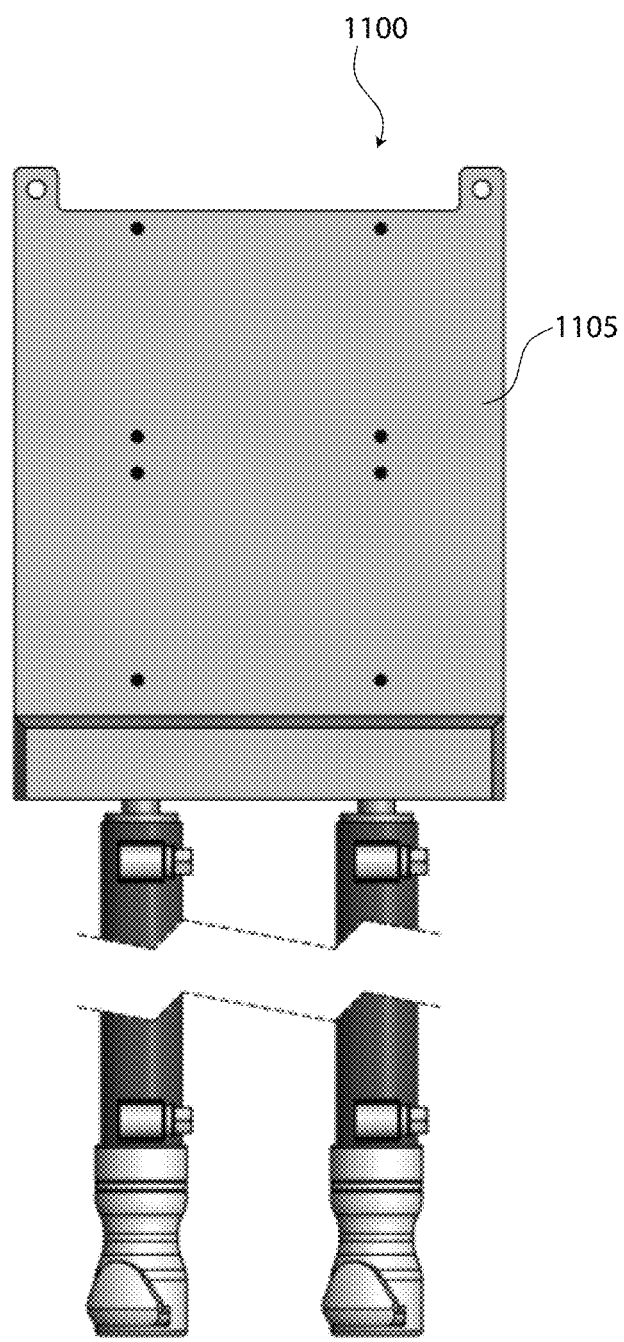
FIG. 11 illustrate a resistor cold plate according to some embodiments.
Figure 12:
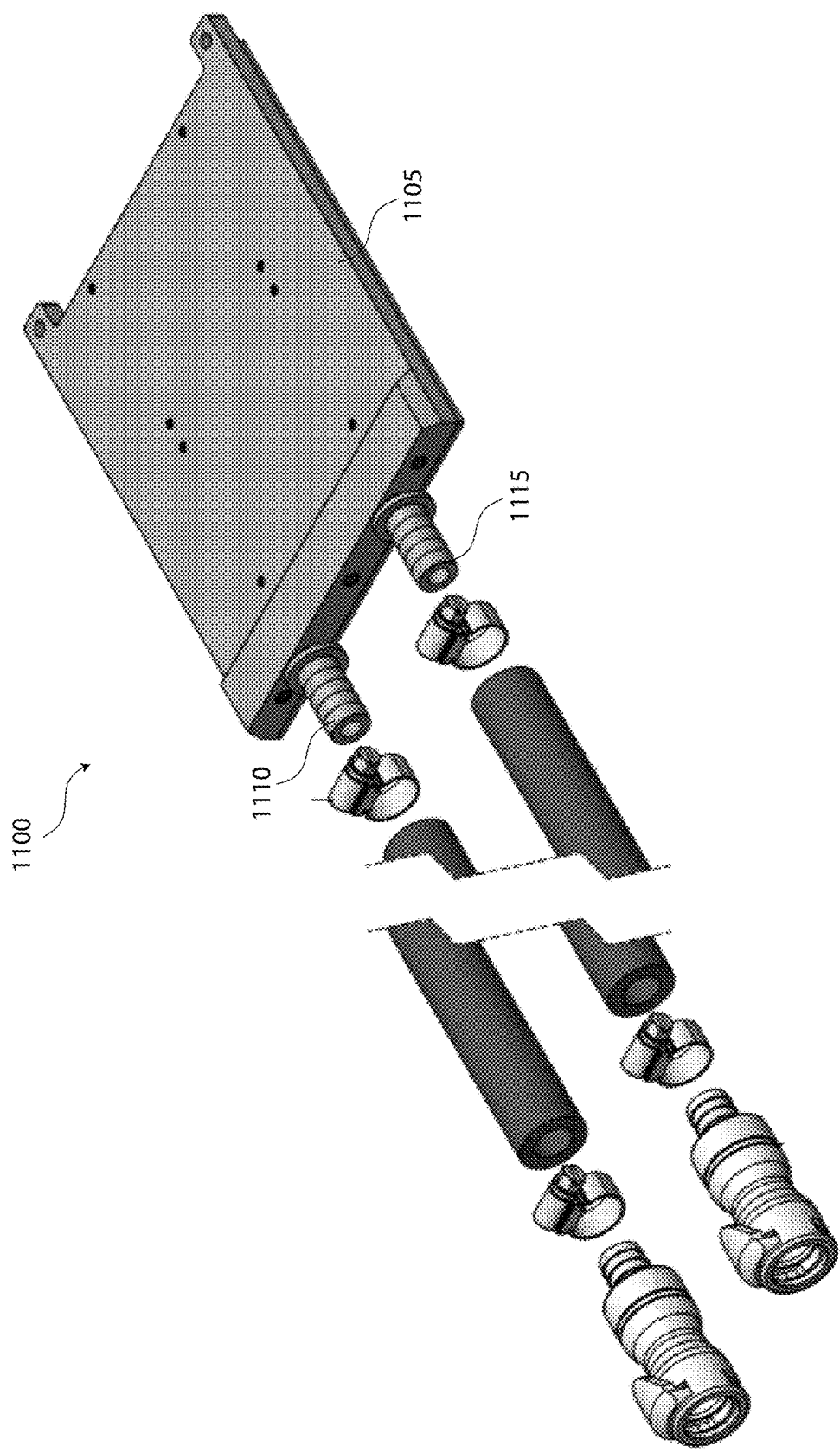
FIG. 12 illustrates a resistor cold plate according to some embodiments.

For example, the cold plates can include one or more resistor cold plates 360, 361, 362, 363, one or more snubber resistor cold plates 370, 371. Examples of the resistor cold plates and snubber resistor cold plates are shown in FIGS. 11 and 12. In some embodiments, the resistor cold plates may include machined or brazed copper so that resistor cold plates can be as thin as possible while handling high pressures/velocities.

For example, the cold plates can include or one or more liquid to air heat exchangers 380, 381. The one or more liquid to air heat exchangers 380, 381 may cool air that circulates inside of the nanosecond pulser system. Fans disposed within the nanosecond pulser system may circulate this cool air through components that do not have liquid-cooled cold plates attached to them. For example, the heat exchanger may be used to cool of diodes, gate drive circuits, switching regulators, etc.

In some embodiments, the main manifold 330 may include a plurality of interconnected orifices coupled with a plurality of connectors. The plurality of connectors can be used to connect tubes with the various components. In some embodiments, each of the plurality of connectors may include a quick connect connectors for ease of assembly, disassembly, or maintenance. In some embodiments, each of the plurality of connectors may include barb connectors which may produce less drag on the system fluid. In some embodiments, the manifold may have orifices of different sizes to allow for different fluid flow rates to different components.

In some embodiments, the cold plates may include various cold plates that can be configured or adapted to couple with various components. In some embodiments, the cold plates may be designed using computational fluid dynamics (CFD) to ensure proper cooling based on the specific operating conditions (e.g., steady state flow rate, pressure, temperature, etc.) or geometry of each component.

In some embodiments, the switch cold plates and the core cold plates may be designed and used to minimize size, stray capacitance, or stray inductance while removing as much heat as possible in a uniform way from each component.

In some embodiments, a core cold plate may introduce less than about 10 pF, about 1 pF, about 100 nF, about 10 nF, etc. of stray capacitance. For example, the stray capacitance measured between secondary winding and ground with the core cold plate in place is less than about 10 nF (or 10 pF, about 1 pF, about 100 nF) greater than the stray capacitance between secondary winding and ground without the core cold plate. As another example, the stray capacitance measured between primary winding and ground with the core cold plate in place is less than about 10 pF, 100 pF, 1 nF, 10 nF, 100 nF greater than the stray capacitance between primary winding and ground without the core cold plate.

In some embodiments, a core cold plate may introduce less than about 1 nH, 10 nH, 100 nH, 1 µH, 10 µH, etc. of stray inductance as measured on the secondary side. For example, the stray inductance measured on the secondary side of the transformer with the core cold plate may be less than 10 µH greater than the stray inductance on the secondary side of the transformer without the core cold plate. As another example, the stray inductance measured on the primary side of the transformer with the core cold plate may be less than 10 nH greater than the stray inductance on the secondary side of the transformer without the core cold plate.

In some embodiments, a switch cold plate may introduce less than about 10 nF of capacitance. For example, a switch may include a heat sink. A switch cold plate may be coupled with the heat sink. A first capacitance between the switch heat sink and ground may be determined without the switch cold plate coupled with the heat sink. A second capacitance between the switch heat sink and ground may be determined with the switch cold plate coupled with the heat sink. The difference between the first capacitance and the second capacitance may be less than about 10 pF-10 nF of capacitance such as, for example, less than about 5 nF of capacitance. As another example, the stray capacitance between a switch cold plate and ground with the switch cold plate coupled with a switch heat sink is less than 5 nF greater than the stray capacitance between the switch heat sink and ground with the first switch cold plate removed.

In some embodiments, the switch cold plate may be coupled with the switch heat sink such that the switch cold plate and the switch heat sink are at the same potential. This may also electrically couple the switch cold plate to the collector (for an IGBT) or the drain (for a MOSFET) because the heat sink in switches can be connected to the collector or drain.

In some embodiments, a thermal (or electrical) insulating material may be disposed between a switch and switch cold plate.

In some embodiments, the switch cold plate and/or the core cold plate may have a geometry that is minimized.

In some embodiments, the various cold plates may be connected to the main manifold 330 in series or in parallel.

In this example, two circuit boards 340, 350 are included that include a pulser and transformer stage (e.g., pulser and transformer stage 101) and a transformer core included on each board. Each board may include one or more switch cold plates that may be in contact with one more switches (e.g., switch S1 in FIG. 1) and/or one or more core cold plates that may be in contact with one transformer cores (e.g., transformer T2 of FIG. 1). A plurality of resistor cold plates are coupled with the resistive output stage resistors (e.g., resistor R1 in FIG. 1), and the snubber resistors (e.g., resistor R3 in FIG. 1). Each of these cold plates may be fluidically connected with the main manifold via copper or plex tubing. In some embodiments, the tubing may have a pipe size of about 0.1", 0.2", 0.5", etc.

In some embodiments, thermal interface materials may be used to bridge the gap between electrical components (e.g., switches, resistors, transformer cores, etc.) and a cold plate (e.g., one or more switch cold plates 341, 351, one or more core cold plates 346, 347, 356, 357, one or more resistor cold plates 360, 361, 362, 363, snubber resistor cold plate 370, 371, one or more liquid to air heat exchangers 380, 381). In some embodiments, thermal interface materials may be placed between tubing and a cold plate (e.g., one or more switch cold plates 341, 351, one or more core cold plates 346, 347, 356, 357, one or more resistor cold plates 360, 361, 362, 363, snubber resistor cold plate 370, 371, one or more liquid to air heat exchangers 380, 381).

In some embodiments, thermal interface materials, for example, can be very thin (e.g., as thin as 0.0005" and up to a thickness of 0.1"), to minimize thermal resistance. In some embodiments, thermal interface materials can have more thickness or uneven thicknesses, to bridge gaps between objects with uneven surfaces or to provide structural rigidity. Thermal interface materials, for example, may be solid, such as, for example, aluminum nitride, or may be deformable, such as, for example, conductive epoxy, thermal paste, or compressible thermal pads. Thermal interface materials can be electrically insulating or electrically conductive depending on application.

In some embodiments, a thermal epoxy can be used to mechanically and thermally attach the core cold plates to a transformer core. The thermal epoxy, for example, has a higher thermal conductivity than standard RTV. In some embodiments, thermally conductive tacky pads, which have a higher thermal conductivity than thermal epoxy but are less structural can be used to couple each switch with a switch cold plate. In some embodiments, clips can be affixed to a switch cold plate with screws, bolts, adhesives, clips, or clamps; or may be soldered, welded, brazed, or built into the switch. In some embodiments, a thin layer of thermal paste, which may be more thermally conductive than the tacky pads, can be used to couple a resistor and resistor core cold plates. In some embodiments, resistors can be screwed down to the resistor cold plate surface, which may provide a constant uniform pressure to optimize heat transfer.

FIG. 4, FIG. 5, and FIG. 6 illustrate embodiments and/or arrangements of a switch cold plate system 400 such as (e.g., switch cold plate 341, 351). The switch cold plate system 400 may include a plurality of switch cold plates 405A, 405B, 405C, 405D, 405E, 405F, 405G, 405H (individually or collectively switch cold plate 405) arranged in a circular or octagonal arrangement (e.g., arranged axial around a central point) to couple with a corresponding circular or octagonal arrangement of switches (e.g., arranged axial around a central point) (e.g., switch S1 in FIG. 1). The switch cold plates 405 may be coupled together via tubing 420, 425. The tubing 420, 425 may, for example, conduct system fluid through the various switch cold plates 405. In some embodiments, two parallel lines of tubing may connect the various switch cold plates 405 and conduct system fluid between the switch cold plates 405.

In some embodiments, each switch cold plate 405 may comprise a first face and a second face. Each switch cold plate 405 may include, for example, one or two channels (or grooves) cut through the second face that are sized and configured to securely couple with the tubing 420, 425 such as, for example, having channel diameter that is substantially similar to a tube diameter. In some embodiments, the first face may be substantially flat and may couple with a surface of a switch (e.g., a flat portion of a switch) using a thermal interface material such as, for example, a thermally conductive paste or adhesive (e.g., aluminum nitride). The channels, for example, may be physically coupled with the tubing using a thermal conductive interface such as, for example, a thermally conductive paste or adhesive (e.g., aluminum nitride). In some embodiments, the tubing 420, 425 may be press fit into the channel of each switch cold plate and/or then brazed to the inlet/outlet manifold 410 or the loop back manifold 415 creating an octagon that may be screwed to a circuit board where the switches are coupled.

In some embodiments, the second face of each switch cold plate 405 may be attached with 1, 2, 4, 8, etc. switches such as, for example, via a thermally conductive paste or adhesive. In some embodiments, each switch cold plate 405 may include one or more mounting holes that can be coupled with a switch.

Figure 15:
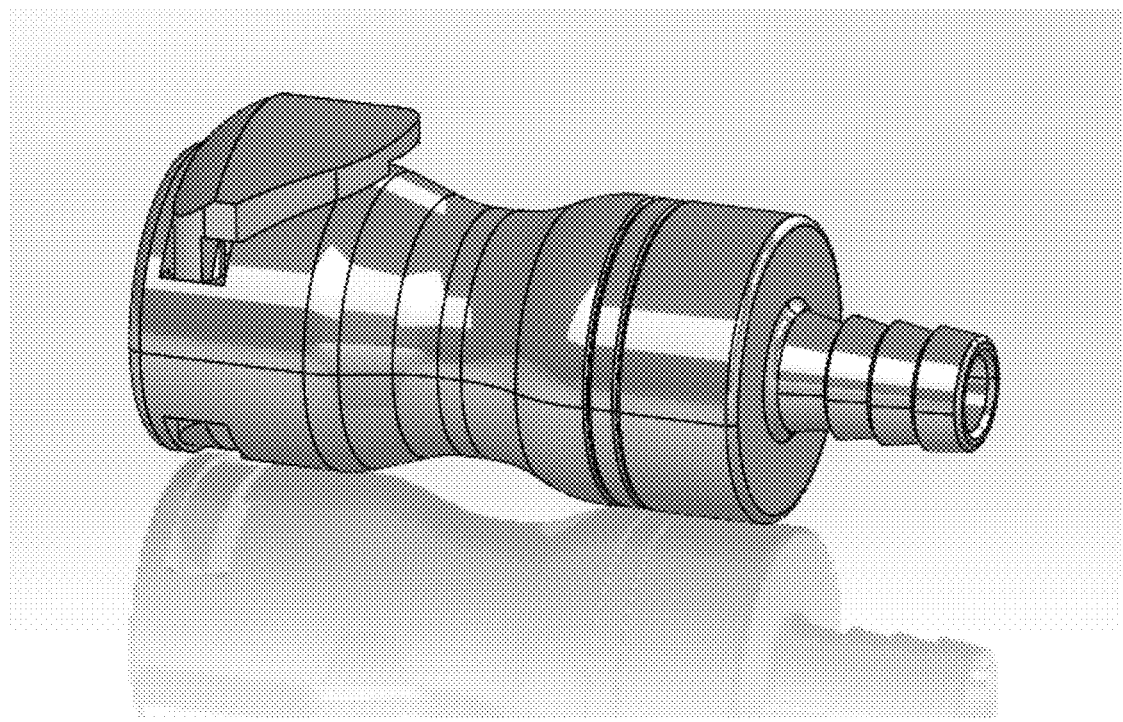
FIG. 15 illustrates an example connector according to some embodiments.

In some embodiments, system fluid can enter the switch cold plate system 400 via an inlet/outlet manifold 410 by entering the inlet/outlet manifold 410 via an inlet port 440 and exit the inlet/outlet manifold 410 via an outlet port 445. In some embodiments, the inlet port 440 may include an inlet connector (e.g., a quick disconnect as shown in FIG. 15). In some embodiments, the outlet port may include an outlet connector (e.g., a quick disconnect as shown in FIG. 15). In some embodiments, the inlet/outlet manifold 410 may comprise an aluminum block of material. In some embodiments, the loop back manifold 415 may comprise a metallic block of material such as, for example, aluminum, brass, bronze, or copper. In some embodiments, the loop back manifold 415 may comprise a plastic.

In some embodiments, the inlet/outlet manifold 410 may split the system fluid into two separate paths: a first path may conduct the system fluid through tubing 420 coupled four switch cold plates 405G, 405F, 405E, 405D and back through tubing 425 also coupled with these four switch cold plates 405G, 405F, 405E, 405D; and a second path may conduct the system fluid through tubing 430 coupled with four switch cold plates 405H, 405A, 405B, 405C and back through tubing 435 also coupled with these four switch cold plates 405H, 405A, 405B, 405C.

In some embodiments, the loop back manifold 415 may receive the system fluid from the tubing 420 and return the system fluid back through tubing 425. In some embodiments, the loop back manifold 415 may receive the system fluid from the tubing 430 and return the system fluid back through tubing 435. This arrangement, for example, may help to keep the temperature difference between the switches small and/or may reduce the number of fittings.

In some embodiments, the loop back manifold 415 may split each side of a polygon (e.g., the eight sides of a octagon) into two sets. Fluid may flow in parallel through each of the two halves of the octagon. This may allow, for example, for reduced temperature change from the inlet of the switch cold plate to the outlet of the switch cold plate. The loop back manifold 415, for example, may also lock together the two sides of the polygon and/or may provide mechanical support."

In some embodiments, a thermal interface material may be placed between tubing 430 or tubing 435 and each switch cold plate 405.

In some embodiments, the inlet/outlet manifold 410 may split the system fluid into a first path the conducts the system fluid in one direction through the various switch cold plates 405 in a one tubing (e.g., tubing 425) and a second path the conducts the system fluid in the opposite direction through the various switch cold plates 405 in another tubing (e.g., tubing 420) without the loop back manifold 415.

In some embodiments, a switch cold plates may maintain the surface temperature of the various switches to a temperature less than about 250 C. In some embodiments, a switch cold plate may remove more than about 1 W of heat from each switch.

FIG. 5 illustrates the switch cold plate system 400 coupled with a circuit board 510 according to some embodiments.

FIG. 6 illustrates another view of the switch cold plate system 400 according to some embodiments. In FIG. 6 the inlet/outlet manifold 410 of the switch cold plate system 400 may be coupled with inlet/outlet manifold 410 to receive system fluid from the main manifold 330 and outlet hosing 615 to return system fluid to the main manifold 330.

Figure 7:
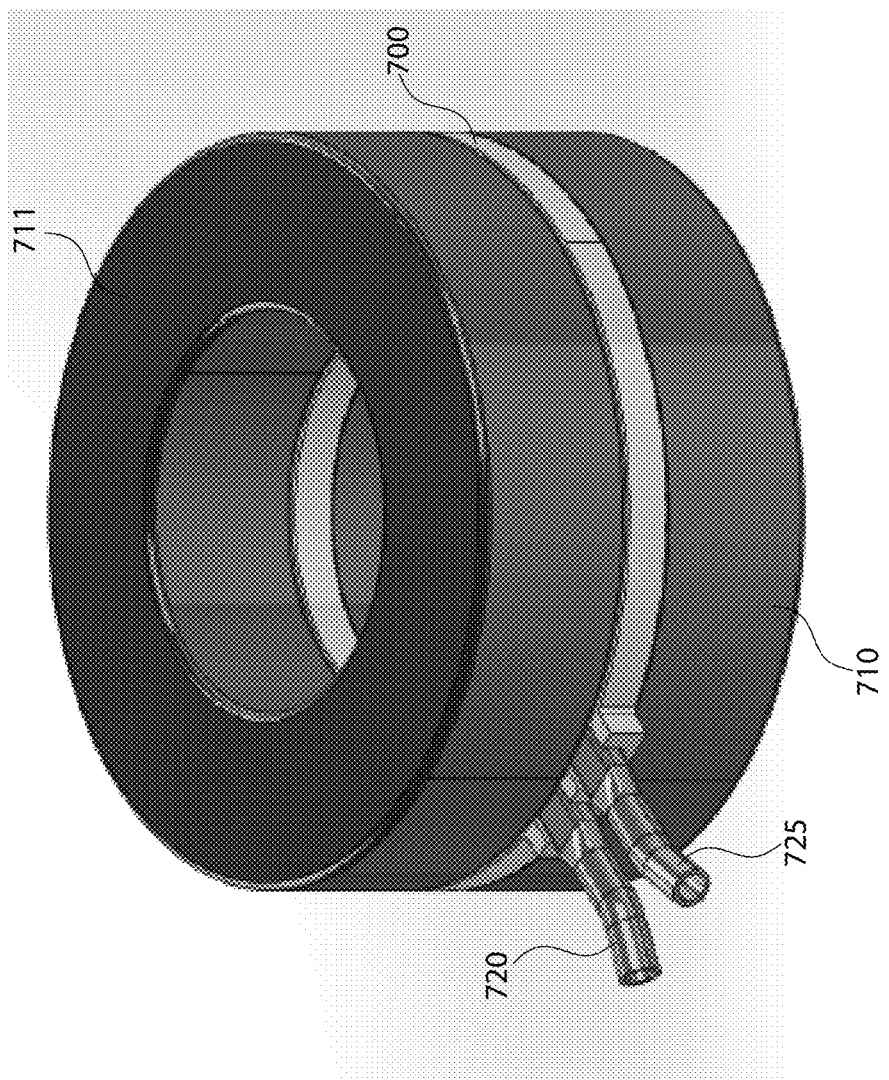
FIG. 7 illustrates a core cold plate according to some embodiments.
Figure 8:
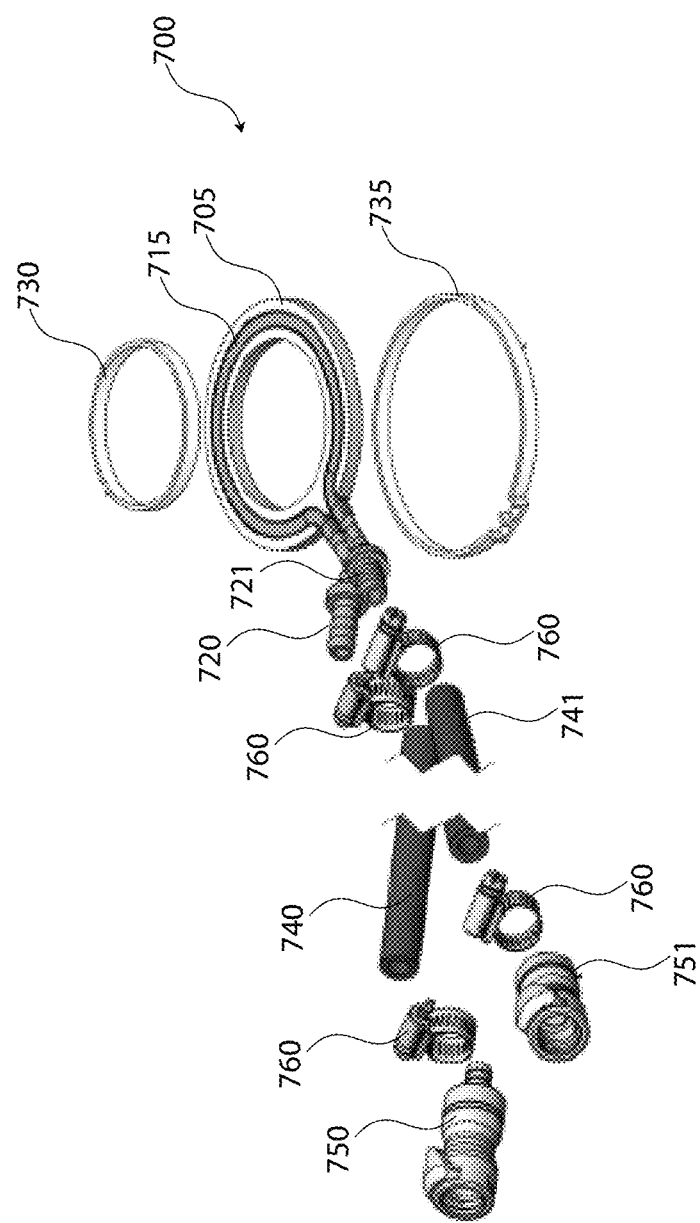
FIG. 8 illustrates a core cold plate according to some embodiments.
Figure 9:
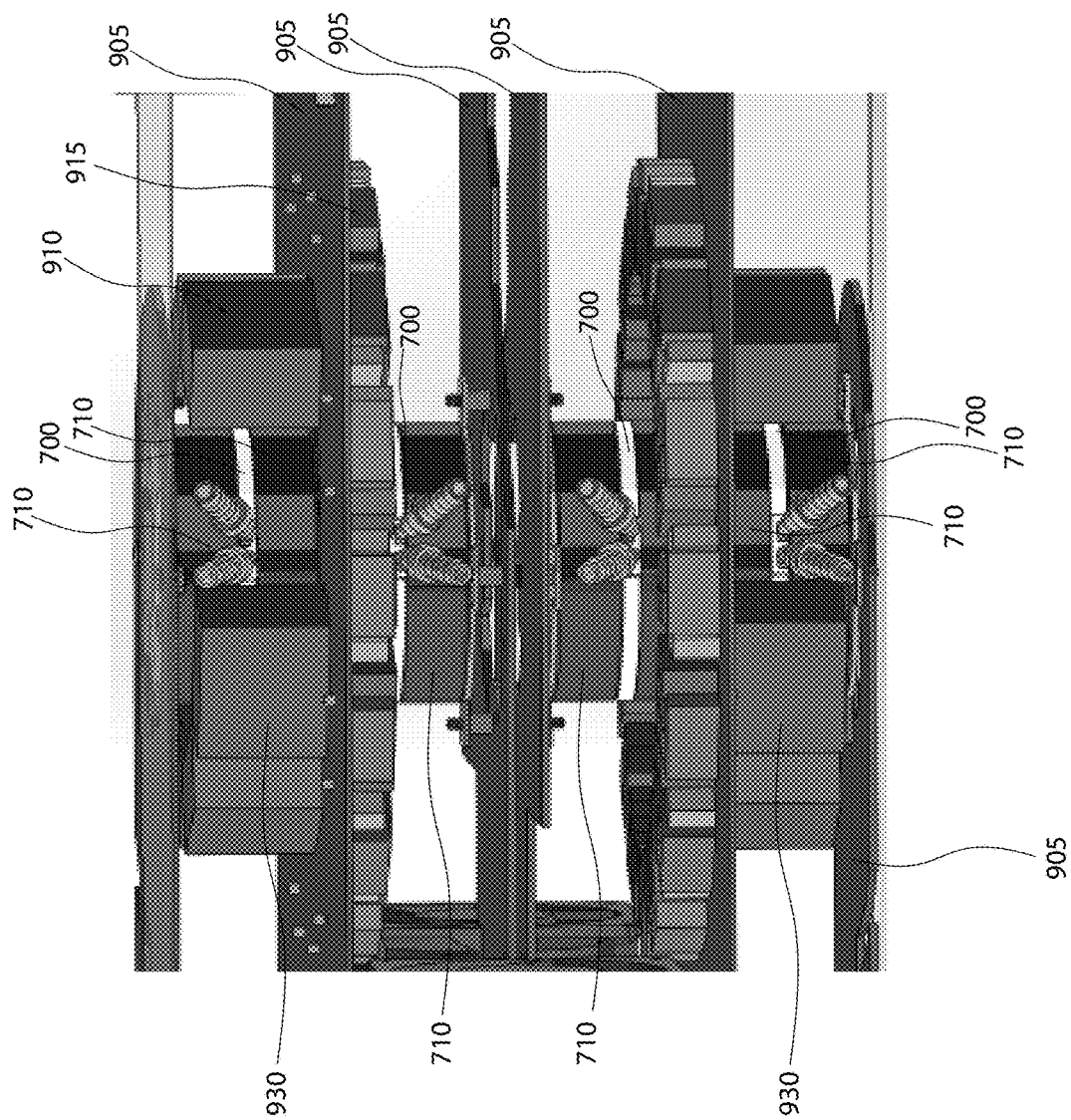
FIG. 9 illustrates a plurality of core cold plates according to some embodiments.
Figure 10:
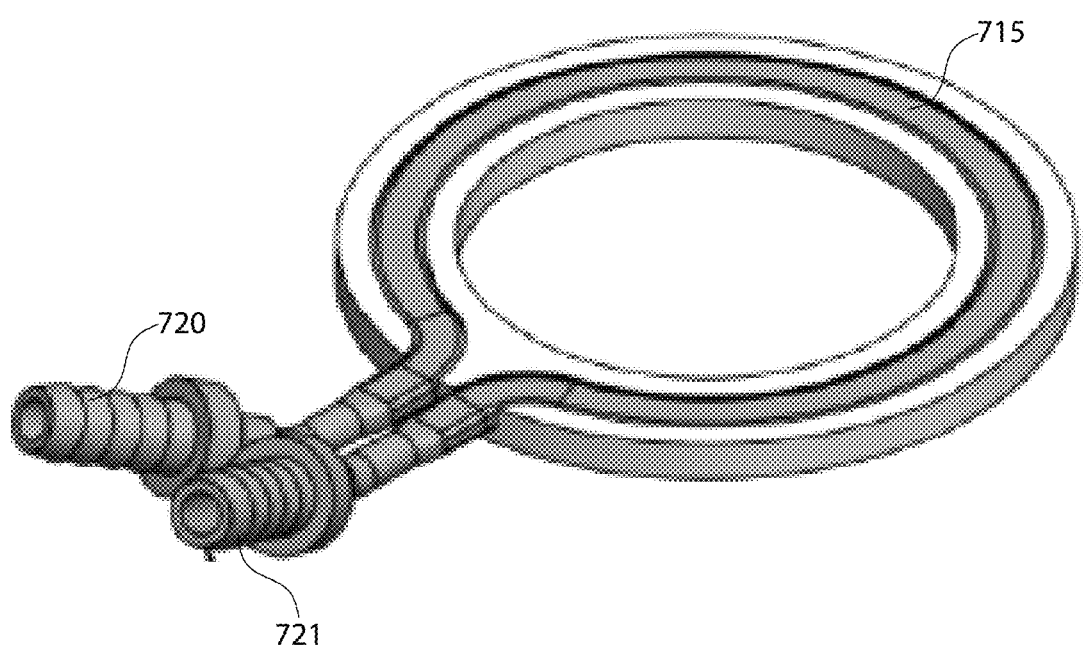
FIG. 10 illustrates a core cold plate according to some embodiments.

FIG. 7, FIG. 8, FIG. 9, and/or FIG. 10 illustrate embodiments and/or arrangements of a core cold plate 700 (e.g., core cold plates 346, 347, 356, 357) according to some embodiments. In some embodiments, the core cold plate 700 can provide thermal dissipation to one or more transformer cores such as, for example, a toroid shaped transformer core. In some embodiments, the core cold plate 700 can be disposed between two transformer cores 710, 711: one transformer core 710 on one side of the core cold plate 700 and the other transformer core 711 on the other side of the core cold plate 700. In some embodiments, embodiments addition core cold plate may be disposed on the other sides of transformer cores 710 and 711.

In some embodiments, a system fluid may be pumped through the internal tube 715 of the core cold plate 700 at a rate of 0.1-10 gallons per minute.

In some embodiments, as shown in FIG. 8, the core cold plate 700 may be made of a flat ring 705 that may include internal tube 715. In some embodiments, the flat ring 705 may have a toroid or donut shape and have an inner aperture. In some embodiments, the flat ring may have an inner circumference or outer circumference. The flat ring 705 may comprise any metal such as, for example, aluminum, brass, steel, bronze, copper, etc. In some embodiments, the internal tube 715 may conduct the system fluid between the two transformer cores 710, 711. The internal tube 715, for example, may include copper tubing.

In some embodiments, the core cold plate 700 includes the flat ring 705, the internal tube 715, an inner ring 730, or an outer ring 735. In some embodiments, the inner ring 730 or the outer ring 735 may comprise plastic or any other insulating material. In some embodiments, the inner ring 730 may have an outer circumference that is substantially similar to the inner circumference of the flat ring 705. In some embodiments, the inner ring 730 may be disposed within the inner aperture of the flat ring 705. In some embodiments, the outer ring 735 may have an inner circumference that is substantially similar to the outer circumference of the flat ring 705.

In some embodiments, the aperture of the flat ring 705, inner ring 730, outer ring 735, transformer core 710, and transformer core 711 can be substantially aligned such as, for example, along an axis through a central axis of each of the aperture of the flat ring 705, inner ring 730, outer ring 735, transformer core 710, and transformer core 711.

In some embodiments, the inner ring 730 or the outer ring 735 may be attached to the inner and outer diameter of the transformer core to allow for standoff from any primary transformer windings and/or secondary transformer windings that may be wound around the transformer core. In some embodiments, the inner ring 730 or the outer ring 735 may reduce capacitive or inductive coupling between the core cold plate 700 and any primary transformer windings and/or secondary transformer windings that may be wound around the transformer core.

In some embodiments, the internal tube 715 may be coupled with inlet connector 720 and outlet connector 725. The inlet connector 720 may be coupled with inlet tubing 740, for example, with clamp 760 (a metallic or plastic clamp), a quick disconnect device, or soldered to together. The inlet tubing 740 may be coupled with connector 750, for example, via clamp 760. The connector 750, for example, may connect with the main manifold 330. The outlet connector 725 may be coupled with outlet tubing 741, for example, with clamp 760. The outlet tubing 741 may be coupled with connector 751, for example, via clamp 760. The connector 751, for example, may connect with the main manifold 330.

In some embodiments, a core cold plate may maintain the surface temperature of a transformer core to a temperature less than about 200 C. 25. In some embodiments, a core cold plate may remove more than about 1 W of heat from a transformer core.

In some embodiments, the transformer core may include a ferrite core. In some embodiments, the transformer core may comprise a toroid shape, a square shape, a rectangular shape, etc. In some embodiments, the transformer may comprise a cylindrical transformer.

FIG. 9 shows eight transformer cores 710 coupled with 4 core cold plates 700. A number of electronic devices (e.g., switches, resistors, capacitors, etc.) 910, 915 are also shown disposed on the various circuit boards 905 and arranged around the various transformer cores 710. FIG. 9 also shows a plurality of capacitors 930 (e.g., switch S1) arranged axially about a central point.

FIG. 11 and FIG. 12 illustrate examples of a resistor cold plate 1100 according to some embodiments. In some embodiments, the resistor cold plate 1100 may be made of machined/brazed copper or aluminum. In some embodiments, the resistor cold plate 1100 may include a metallic block 1105 coupled with an inlet port 1110 and an outlet port 1115. In some embodiments, the resistor cold plate 1100 can include internal tube coupled with the inlet port 1110 and the outlet port 1115 that can route system fluid within the resistor cold plate 1100.

Figure 13:
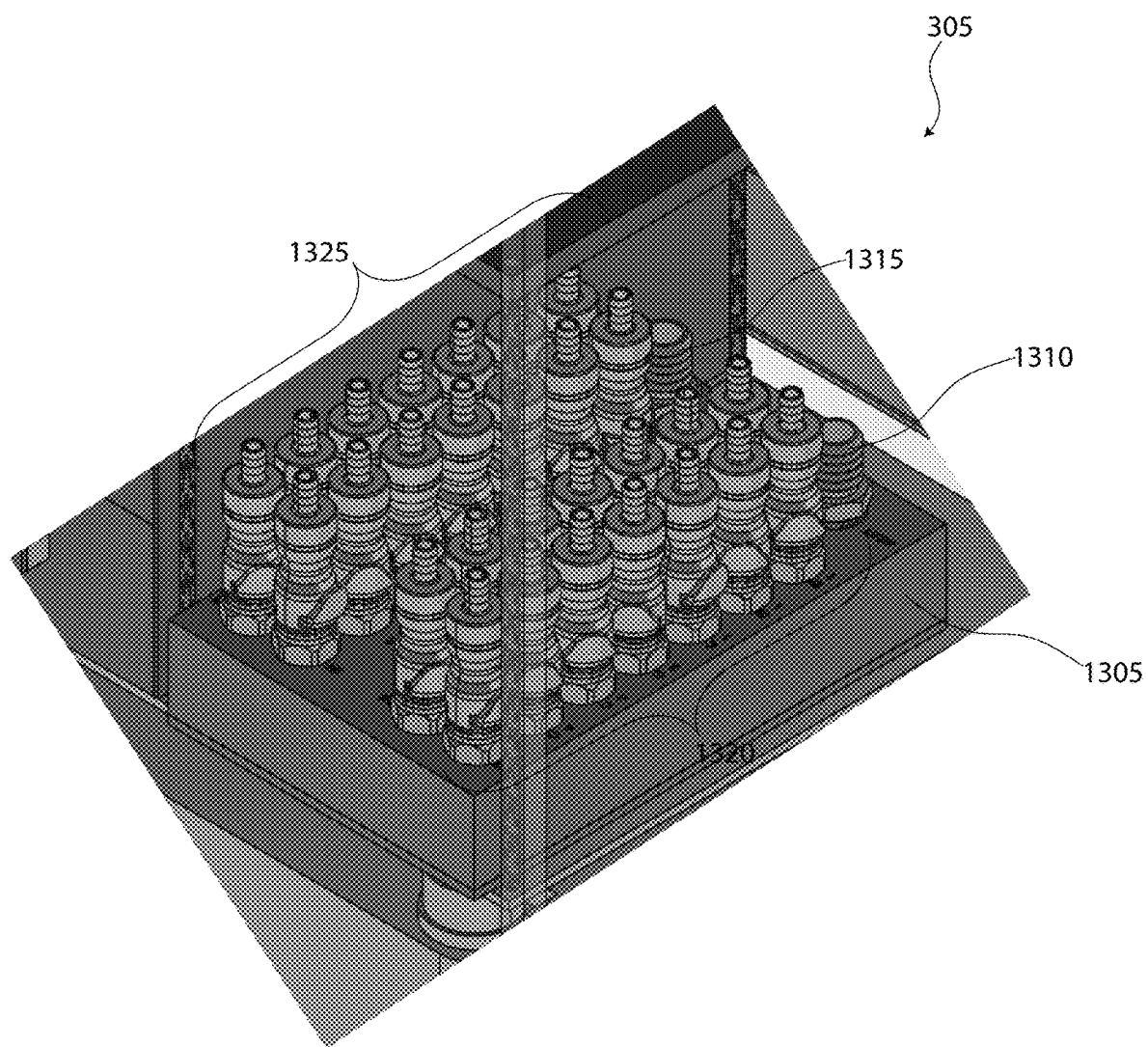
FIG. 13 illustrates a main manifold of a thermal management system according to some embodiments.
Figure 14B:
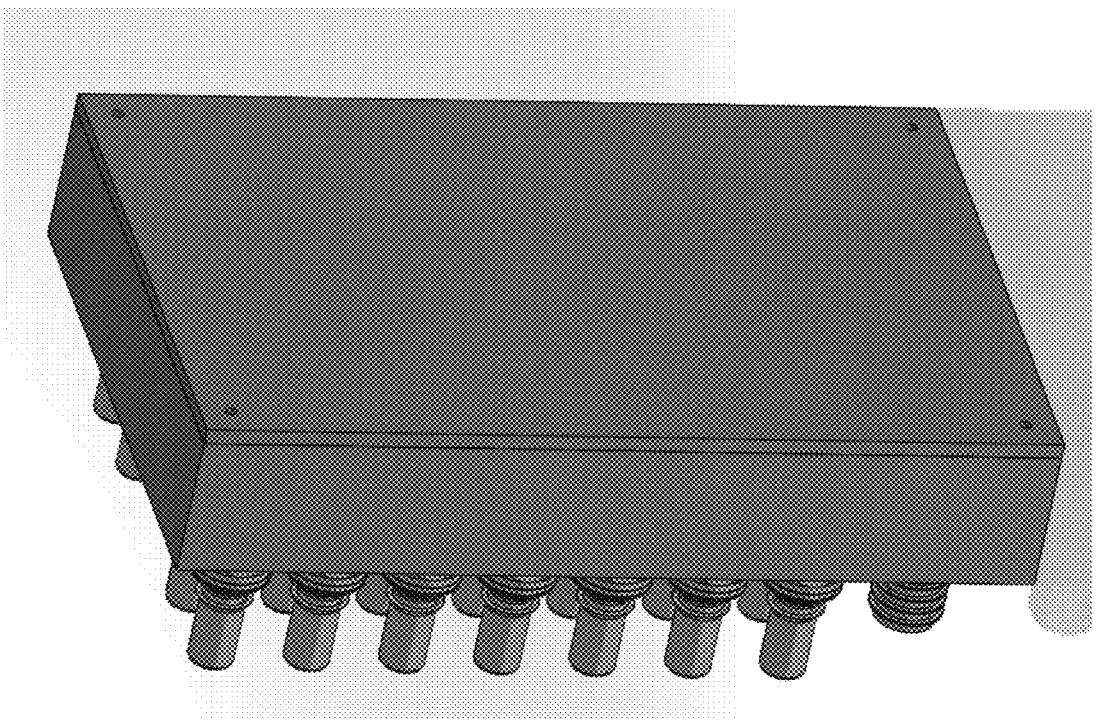
FIG. 14A & FIG. 14B illustrate a main manifold of a thermal management system according to some embodiments.
Figure 14A:
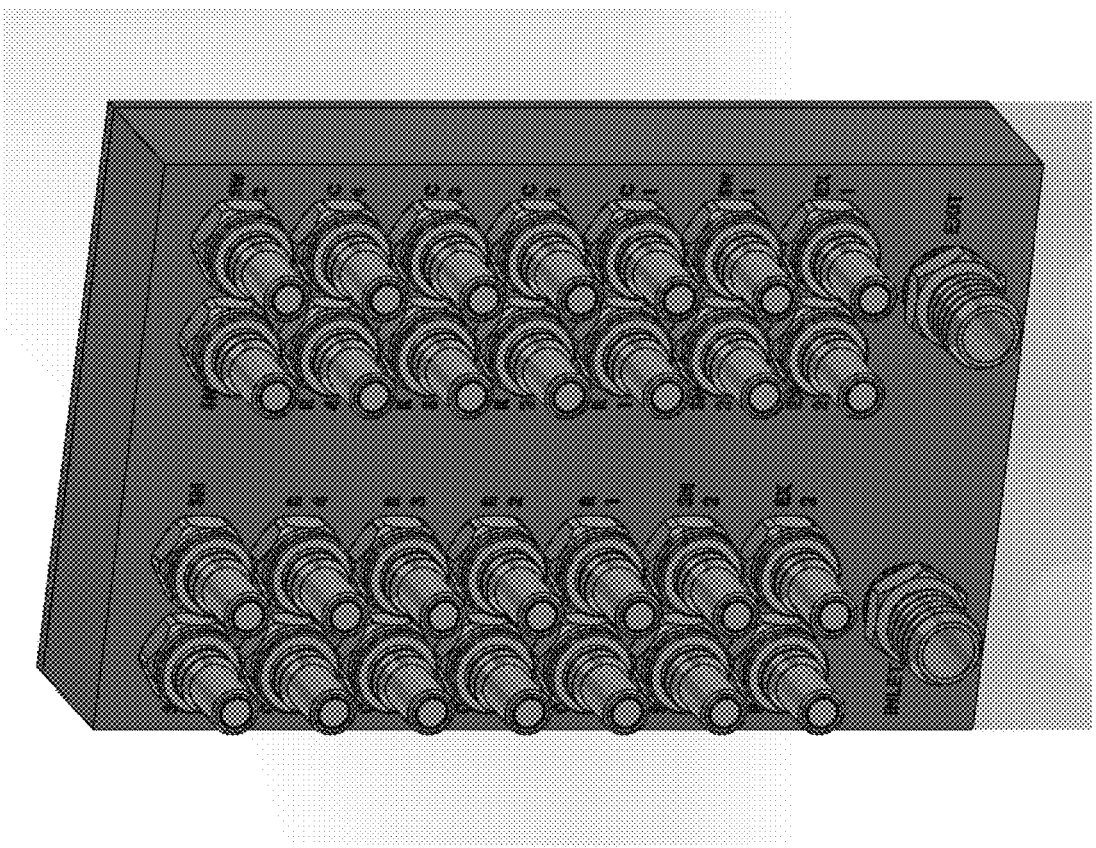

FIG. 13, FIG. 14A, and FIG. 14B illustrate a main manifold 305 according to some embodiments. The main manifold 305, for example, may include a manifold body 1305, a main inlet port 1310, a main outlet port 1315, a plurality of outlet ports 1320, and a plurality of inlet ports

1325. Cooled system fluid from a heat exchanger may enter the main manifold 305 via inlet port 1310. The main inlet port 1310 may be coupled internally with the plurality of outlet ports 1320 such that the system fluid may flow from the main inlet port 1310 out to a plurality of cold plates via the plurality of outlet ports 1320. Warm system fluid may be received at the main manifold 305 from the plurality of cold plates via the plurality of inlet ports 1325. The plurality of inlet ports 1325 may be coupled internally with the main outlet port 1315 such that system fluid flows to the heat exchanger via the main outlet port 1315.

The main inlet port 1310, the main outlet port 1315, the plurality of inlet ports 1325, or the plurality of outlet ports 1320 may include a quick disconnect as shown in FIG. 15. The quick disconnect may fluidically couple the main manifold 305 with one or more tubes that can be coupled within one or more cold plates. Alternatively or additionally, the ports may be connected with the tubes via clamps, barbed fittings, soldering, brazing, etc. In the event a tube is not coupled with one of the disconnects the corresponding port will be closed.

In some embodiments, the temperature change of the fluid from an inlet port to an outlet port may be less than about 100 C. In some embodiments, the pressure drop of the fluid from an inlet port to an outlet port may be less than about 1000 kPa. In some embodiments, the volume of fluid contained inside of the thermal management system may be less than about 1000 L. In some embodiments, the flow rate of fluid through the system may be greater than about 0.1 L/minute.

Figure 16:
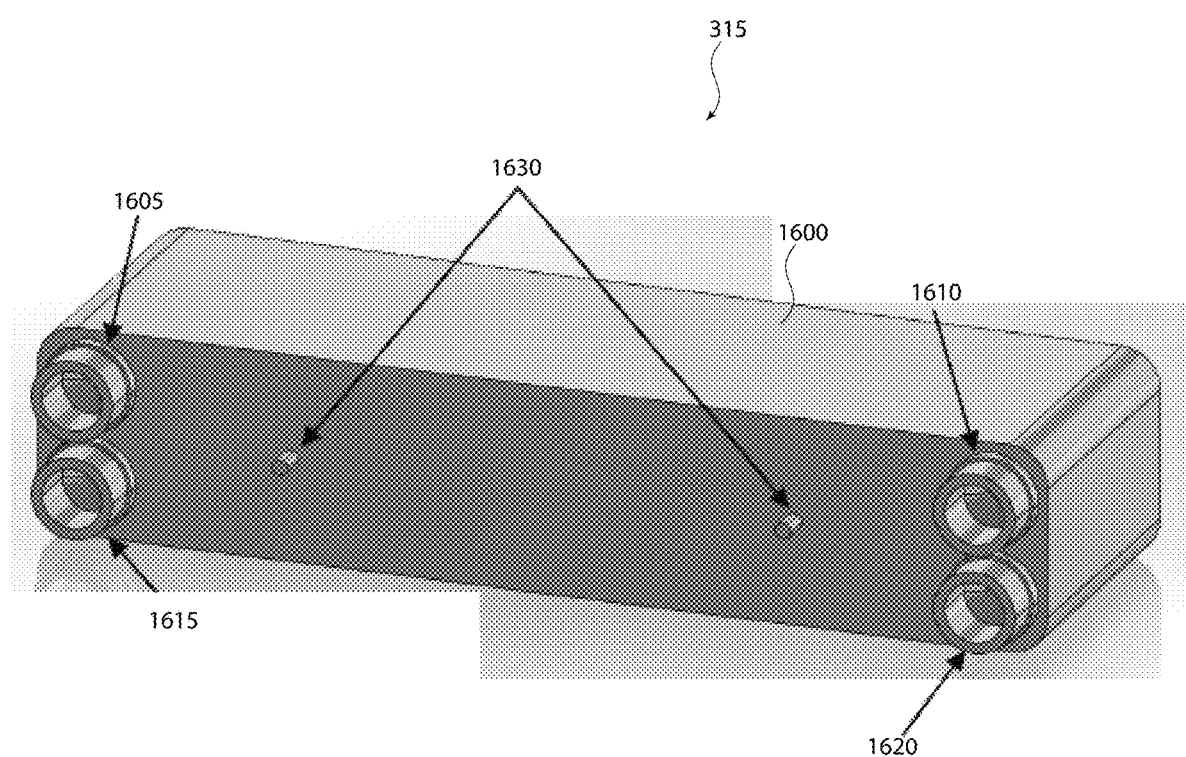
FIG. 16 illustrates a heat exchanger according to some embodiments.

FIG. 16 illustrates a heat exchanger 310 according to some embodiments. In some embodiments, facility fluid (or water from any other source) may enter the heat exchanger 310 through water inlet port 1605 and exit the heat exchanger 310 through water outlet port 1610. The heat exchanger body may include a metal block that includes a water channel coupled with the water inlet port 1605 and the water outlet port 1610. In some embodiments, the system fluid may enter the heat exchanger 310 through dielectric inlet port 1615 and exit the heat exchanger 310 through dielectric outlet port 1620. The heat exchanger body 1600 may include a dielectric channel coupled with the dielectric inlet port 1615 and the dielectric outlet port 1620. The water channel and the dielectric channel may be formed within the heat exchanger body 1600 and allow heat transfer from the system fluid to the facility fluid. The facility fluid or the system fluid may flow through the heat exchanger 310 at any flow rate such as, for example, at about 10-30 gallons per minute or about 15-20 gallons per minute.

In some embodiments, the high voltage nanosecond pulser system may include an inert gas purge system. The inert gas purge system, for example, may introduce an inert gas into the high voltage nanosecond pulser system with a pressure greater than ambient pressure such as, for example, a pressure greater than one atmosphere. The inert gas purge system, for example, may use any inert gas such as, for example, nitrogen, argon, helium, or any noble gas, etc. In some embodiments, this inert gas may displace any ambient air within the high voltage nanosecond pulser system. Air and inert gas, for example, may be forced out of the high voltage nanosecond pulser system through gaps, screw holes, vents, or orifices, etc. Because ambient air may include moisture, forcing the ambient air from the high voltage nanosecond pulser system may, for example, prevent condensation within the high voltage nanosecond pulser system. This, for example, may allow the high voltage nanosecond pulser system to be run with the system fluid at a lower temperature compared to systems that do not use an inert gas. Lower cooling temperatures may increase system performance.

In some embodiments, a thermal management system may include a number of sensors such as, for example, pressure sensors within one or more system fluid lines, a heat sensor (e.g., a thermometer, thermistor, or thermocouple), liquid level sensor (e.g., within the reservoir 320), a liquid leak sensor, or flow meters. In some embodiments, a flow meter may be disposed within or in line with one or more of the system fluid tubes. In some embodiments, a flow meter may be disposed within or in line with one or more of the water tubes. In some embodiments, a heat sensor may be disposed within a system fluid tube, at the inlet/outlet manifold 410 or the outlet port 445 of the switch cold plate system 400.

In some embodiments, these sensors may provide data to an interlock system (or a controller) that can adjust flow rates of either or both the system fluid or the facility fluid such as, for example, by changing a pump speed or opening or closing various valves throughout the system. In some embodiments, a high voltage power supply may not turn on or may automatically turn off a certain sensor values (or averages) are or are not achieved.

In some embodiments, the temperature of the system fluid may be measured at the main manifold, before the heat exchanger, the pump output, a resistor cold plate, a core cold plate, a switch cold plate, or any other location. In some embodiments, the air temperature within the high voltage power supply may be monitored using air temperature sensors such as, for example, surface mount sensors.

In some embodiments, the high voltage power supply may not turn on unless the flow rate of water is above a flow threshold such as, for example, above about 1, 2.5, 5, 7.5, or 10 gallons per minute. In some embodiments, the high voltage power supply may not turn on unless the flow rate of water is below a flow threshold such as, for example, below about 10, 20, 50, or 100 gallons per minute. The water flow rate, for example, may be measured at or near the water inlet port 1605.

In some embodiments, the high voltage power supply may not turn on unless the flow rate of system fluid is above a flow threshold such as, for example, about 1, 2.5, 5, 7.5, or 10 gallons per minute. In some embodiments, the high voltage power supply may not turn on unless the flow rate of system fluid is below a flow threshold such as, for example, below about 10, 20, 50, or 100 gallons per minute. The system fluid flow rate, for example, may be measured at or near the pump 325.

In some embodiments, the high voltage power supply may not turn on if the input water temperature or the system fluid temperature is greater than a temperature threshold such as, for example, a temperature threshold of about 20 to 50 C, about 20 to 25 C, or about 20 C.

In some embodiments, the high voltage power supply may turn off if the input water temperature or the system fluid temperature is greater than a temperature threshold such as, for example, a temperature threshold of about 50 to 70 C, about 50 to 60 C, or about 50 C.

In some embodiments, the high voltage power supply may turn off if the system fluid level in the reservoir (e.g., reservoir 320) is less than a certain amount or less than a percentage full such as, for example, less than about 30% to 75%, about 30% to 50%, or about 30% full.

In some embodiments, the high voltage power supply may turn off if the temperature of system fluid exiting one or more switch cold plates (e.g., switch cold plate 341, 351, or 400) is greater than a temperature threshold such as, for example, 50 to 75 C, about 50 to 55 C, or about 50 C.

In some embodiments, the high voltage power supply may turn off or not turn on if the pressure in the system fluid system is below a pressure threshold such as, for example, below about 0 to 1.5 bar, about 0.5 to 1 bar, or about 1 bar. In some embodiments, the high voltage power supply may turn off or not turn on if the pressure in the system fluid system is above a pressure threshold such as, for example, above about 1.7 to 3 bar, about 1.75 to 2 bar, about 1.75 bar. The pressure of the system fluid, for example, may be measured within any dielectric tubes or pipes coupled with the main manifold 305.

In some embodiments, the high voltage power supply may turn off or not turn on if the if the pressure from a nitrogen sensor is below a pressure threshold such as, for example, below the atmospheric pressure.

In some embodiments, the high voltage power supply may turn off or not turn on if a leak sensor indicates that a fluid leak (either the system fluid or the facility fluid) has occurred. The leak sensor, for example, may include an optical sensor that indicates the presence of liquid if the optical sensor is obscured.

In some embodiments, any of the sensors may comprise a switch sensor. A switch sensor, for example, may automatically close a switch in the event a sensed threshold has been met. The switch, for example, may open or close a circuit.

Figure 17:
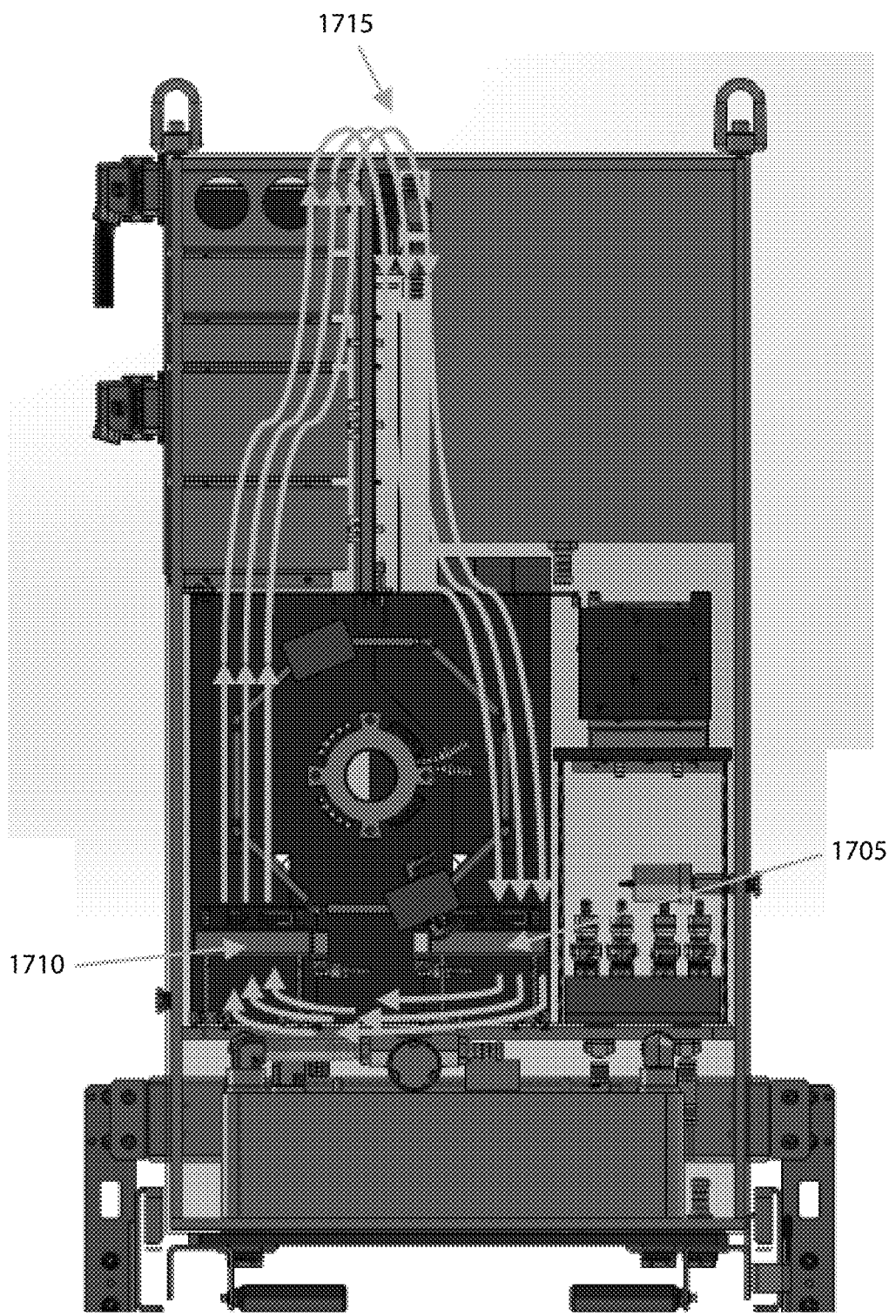
FIG. 17 illustrates air flow within the nanosecond pulser system according to some embodiments.

In some embodiments, a plurality of fans may be disposed within the high voltage nanosecond pulser system. FIG. 17 illustrates air flow within the high voltage nanosecond pulser system according to some embodiments. In this example, three fans 1705, 1710, 1715 are used to circulate air within the high voltage nanosecond pulser system. In this example, the various fans are placed so that they create an air flow pattern that circulates chilled air from the bottom upwards around the side of various modules, such as, for example, through a control interconnect board, and back down to various heat exchangers that may be coupled to either or both the system fluid system or a facility fluid system.

Figure 18:
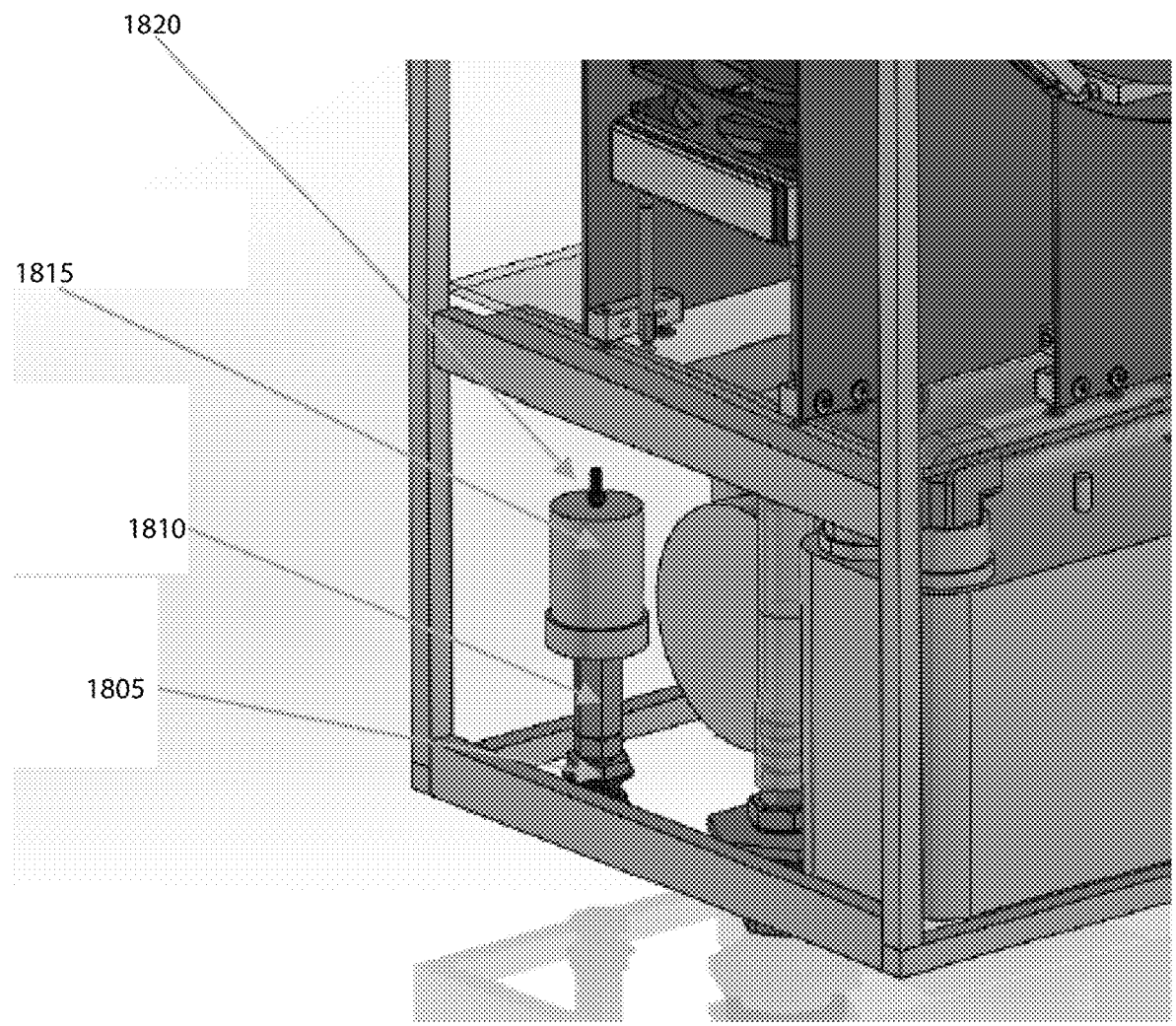
FIG. 18 illustrates a nitrogen purge according to some embodiments.

FIG. 18 illustrates a nitrogen purge according to some embodiments. In some embodiments, nitrogen may flow through the system to reduce the possibility of condensation developing on cooling components. In some embodiments, nitrogen may enter through a nitrogen bulkhead 1805 (e.g., on the bottom side of the chassis), pass through a filter 1810, a nitrogen sensor 1815, and out of an orifice limiter 1820 (e.g., limits the nitrogen flow to 10 liters per minute) into the high voltage nanosecond pulser system. In some embodiments, nitrogen may leave the chassis through another bulkhead, through gaps in the chassis or body, or at any another point in the chassis Unless otherwise specified, the term "substantially" means within 5% or 10% of the value referred to or within manufacturing tolerances. Unless otherwise specified, the term "about" means within 5% or 10% of the value referred to or within manufacturing tolerances.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A nanosecond pulser system comprising:
    a plurality of switches electrically coupled in parallel, each of the plurality of switches having a switch heat sink;
    a transformer comprising:
        at least one transformer core that includes a first core surface;
        a plurality of primary windings electrically coupled with the plurality of switches; and
        a plurality of secondary windings;
    an output electrically coupled with the plurality of secondary windings, the output providing pulses having a voltage greater than about 1 kV, a pulse width less than about 1 μs, and a pulse repletion frequency greater than about 20 kHz;
    at least one switch cold plate physically coupled with the first switch surface of at least a subset of the plurality of switches, the at least one switch cold plate comprising a metal; and
    a core cold plate physically coupled with the first core surface, the core cold plate comprising a metal.

2. The nanosecond pulser system according to claim 1, wherein the stray capacitance between the switch cold plate and ground with the switch cold plate is less than 5 nF greater than the stray capacitance between a switch heat sink and ground with the switch cold plate removed.

3. The nanosecond pulser system according to claim 1, wherein the stray capacitance between secondary winding and ground with the core cold plate is less than 5 nF greater than the stray capacitance between secondary winding and ground without the core cold plate.

4. The nanosecond pulser system according to claim 1, wherein the stray inductance on the secondary side of the transformer with the core cold plate is less than 10 μH greater than the stray inductance on the secondary side of the transformer without the core cold plate.

5. The nanosecond pulser system according to claim 1, wherein the stray inductance on the primary side of the transformer with the core cold plate is less than 10 nH greater than the stray inductance on the primary side of the transformer without the core cold plate.

6. The nanosecond pulser system according to claim 1, wherein the switch cold plate and each switch heat sink are electrically coupled and have the same electric potential.

7. The nanosecond pulser system according to claim 1, further comprising an insulating material disposed between the switch cold plate and a heat sink.

8. The nanosecond pulser system according to claim 1, further comprising an insulating material disposed between the core cold plate and the transformer core, the plurality of primary windings, and the plurality of secondary windings.

9. The nanosecond pulser system according to claim 8, wherein the insulating material has a thickness greater than about 0.01 mm.

10. The nanosecond pulser system according to claim 1, further comprising:
a plurality of tubes coupled with the core cold plate and the switch cold plate; and
a fluid that flows through the plurality of tubes.

11. The nanosecond pulser system according to claim 10, wherein the fluid comprises a di-electric fluid, Galden, Coolanol, or water.

12. The nanosecond pulser system according to claim 1, further comprising one or more fans positioned to allow a gas to circulate near the switch cold plate and the core cold plate.

13. The nanosecond pulser system according to claim 1, further comprising:
a nanosecond pulser enclosure within which the plurality of switches, the transformer, switch cold plate, and the transformer core cold plate are disposed; and
an inert gas subsystem disposed within the nanosecond pulser enclosure that releases an inert gas into the nanosecond pulser enclosure with a pressure greater than atmospheric pressure.

14. The nanosecond pulser system according to claim 1, wherein the transformer comprises a second transformer core, and the core cold plate is disposed between the transformer core and the second transformer core.

15. A nanosecond pulser system comprising:
a plurality of switches arranged axially around a central point;
a plurality of switch cold plates having a substantially flat surface, each of the substantially flat surfaces of the plurality of switch cold plates physically coupled with at least one of the plurality of switches and the plurality of switch cold plates are arranged axially around the central point;
a tube physically coupled with each of the plurality of switch cold plates; and
an inlet connector and an outlet connector coupled with the tube;
wherein a dielectric fluid flows through the inlet connector, into the tube, and out the outlet connector.

16. The nanosecond pulser system according to claim 15, wherein each switch of the plurality of switches includes a switch heat sink; and
wherein the stray capacitance between a first switch cold plate of the plurality of switch cold plates and ground with the first switch cold plate coupled with a switch heat sink is less than 5 nF greater than the stray capacitance between a switch heat sink and ground with the first switch cold plate removed.

17. The nanosecond pulser system according to claim 15, further comprising a thermal interface material disposed between the plurality of switch cold plates and the plurality of switches.

18. The nanosecond pulser system according to claim 15, further comprising a heat exchanger coupled with the inlet connector and the outlet connector, the heat exchanger also including a facility fluid inlet and a facility fluid outlet.

19. A nanosecond pulser system comprising:
a core cold plate comprising:
a top surface;
a bottom surface;
an internal tube comprising a ring with an aperture, an outer circumference, and having a first end and a second end;
an inlet connector coupled with the first end of the internal tube;
an outlet connector coupled with the second end of the internal tube; and
a transformer comprising:
a transformer core having a toroid shape with a top surface, a bottom surface, and a transformer hole that passes through the middle of the transformer core, wherein either the bottom surface or the top surface of the transformer core is coupled with the top surface of the core cold plate;
primary windings wound around the transformer core; and
secondary windings wound around the transformer core.

20. The nanosecond pulser system according to claim 19, further comprising a second transformer comprising:
a second transformer core having a toroid shape with a second top surface, a second bottom surface, and a second hole that passes through the middle of the second transformer core, wherein either the second bottom surface or the second top surface of the second transformer core is coupled with the bottom surface of the core cold plate;
primary windings wound around the transformer core; and
secondary windings wound around the transformer core.

21. The nanosecond pulser system according to claim 19, wherein either or both the inner ring and the outer ring comprise an insulating material.

22. The nanosecond pulser system according to claim 19, further comprising a heat exchanger coupled with the inlet connector and the outlet connector, the heat exchanger also including a facility fluid inlet and a facility fluid outlet.

23. The nanosecond pulser system according to claim 19, further comprising a flat ring within which the internal tube is disposed.

24. The nanosecond pulser system according to claim 19, wherein the stray inductance on the primary side of the transformer with the core cold plate is less than 10 nH greater than the stray inductance on the primary side of the transformer without the core cold plate.

* * * * *